United States Patent [19]
Davies et al.

[11] Patent Number: 5,541,132
[45] Date of Patent: Jul. 30, 1996

[54] INSULATED GATE SEMICONDUCTOR DEVICE AND METHOD OF MANUFACTURE

[75] Inventors: Robert B. Davies, Tempe; Vida Ilderem, Phoenix; Mark D. Griswold; Diann Dow, both of Chandler; James E. Prendergast, Phoenix; Iksung Lim, Tempe; Juan Buxó, Mesa, all of Ariz.; Richard D. Sivan, Austin, Tex.; James D. Burnett, Austin, Tex.; Frank K. Baker, Austin, Tex.

[73] Assignee: Motorola, Inc., Schaumburg, Ill.

[21] Appl. No.: 408,653

[22] Filed: Mar. 21, 1995

[51] Int. Cl.⁶ .................................. H01L 21/265
[52] U.S. Cl. .................. 437/45; 437/41; 437/44
[58] Field of Search ............ 437/41 GS, 41 CS, 437/40 GS, 44, 45

[56] References Cited

U.S. PATENT DOCUMENTS

| | | |
|---|---|---|
| 4,619,038 | 10/1986 | Pintchovski . |
| 4,949,136 | 8/1990 | Jain . |
| 4,968,639 | 11/1990 | Bergonzoni . |
| 5,170,232 | 12/1992 | Narita . |
| 5,202,277 | 4/1993 | Kameyama et al. ............... 437/44 |
| 5,372,960 | 12/1994 | Davies et al. . |
| 5,413,949 | 5/1995 | Hong ................................ 437/45 |
| 5,427,964 | 6/1995 | Kaneshiro et al. ............... 437/45 |

FOREIGN PATENT DOCUMENTS

| | | |
|---|---|---|
| 0387722 | 9/1990 | European Pat. Off. . |
| 56-33881 | 4/1981 | Japan . |
| 63-44769 | 2/1988 | Japan . |
| 4154171 | 5/1992 | Japan . |

*Primary Examiner*—Mary Wilczewski
*Assistant Examiner*—Brian K. Dutton
*Attorney, Agent, or Firm*—Rennie William Dover

[57] ABSTRACT

An insulated gate field effect transistor (10) having an reduced gate to drain capacitance and a method of manufacturing the field effect transistor (10). A dopant well (13) is formed in a semiconductor material (11). A gate oxide layer (26) is formed on the dopant well (13) wherein the gate oxide layer (26) and a gate structure (41) having a gate contact portion (43) and a gate extension portion (44). The gate contact portion (43) permits electrical contact to the gate structure (41), whereas the gate extension portion (44) serves as the active gate portion. A portion of the gate oxide (26) adjacent the gate contact portion (43) is thickened to lower a gate to drain capacitance of the field effect transistor (10) and thereby increase a bandwidth of the insulated gate field effect transistor (10).

19 Claims, 19 Drawing Sheets

INSULATED GATE SEMICONDUCTOR DEVICE AND METHOD OF MANUFACTURE

FIELD OF THE INVENTION

The present invention relates, in general, to insulated gate semiconductor devices, and more particularly, to controlling a threshold voltage, VT, in insulated gate semiconductor devices.

BACKGROUND OF THE INVENTION

As those skilled in the art are aware, $V_T$ is related to the voltage at which an insulated gate semiconductor device turns on and varies in accordance with the carrier concentration of the channel region. For example, the gate-source voltage ($V_{GS}$) of an N-channel insulated gate semiconductor device must exceed $V_T$ to form a channel in the insulated gate semiconductor device. Since the voltage at the gate is typically the input voltage of the insulated gate semiconductor device, the input voltage relative to the source voltage must exceed $V_T$ for a conducting channel to be formed. In other words, a significant drain current ($I_D$) will not flow through a channel region of the insulated gate semiconductor device unless $V_{GS}$ is greater than $V_T$. In addition, $V_T$ is important in determining the saturation current of an insulated gate semiconductor device, which in turn helps to determine the power bandwidth of the device.

Although precise control of $V_T$ is highly desirable in all insulated gate semiconductor device applications, it is particularly important in low voltage applications. In insulated gate semiconductor devices using standard power supply levels, the difference between the upper power supply rail (5 volts) and the lower power supply rail (0 volts) is sufficiently large, i.e., approximately 5 volts, that fluctuations in $V_T$ have a negligible effect on the device performance. However, in low voltage applications when the difference between the power supply rails is less than 1.5 volts, $V_T$ represents a substantial portion of the total power supply voltage. Consequently, fluctuations in $V_T$ result in large fluctuations of the current drive capability of the insulated gate semiconductor device.

Accordingly, it would be advantageous to have an insulated gate semiconductor device and method of manufacturing the insulated gate semiconductor device wherein the threshold voltage is controlled for low voltage insulated gate semiconductor device applications.

DETAILED DESCRIPTION OF THE DRAWINGS

Figure 1:
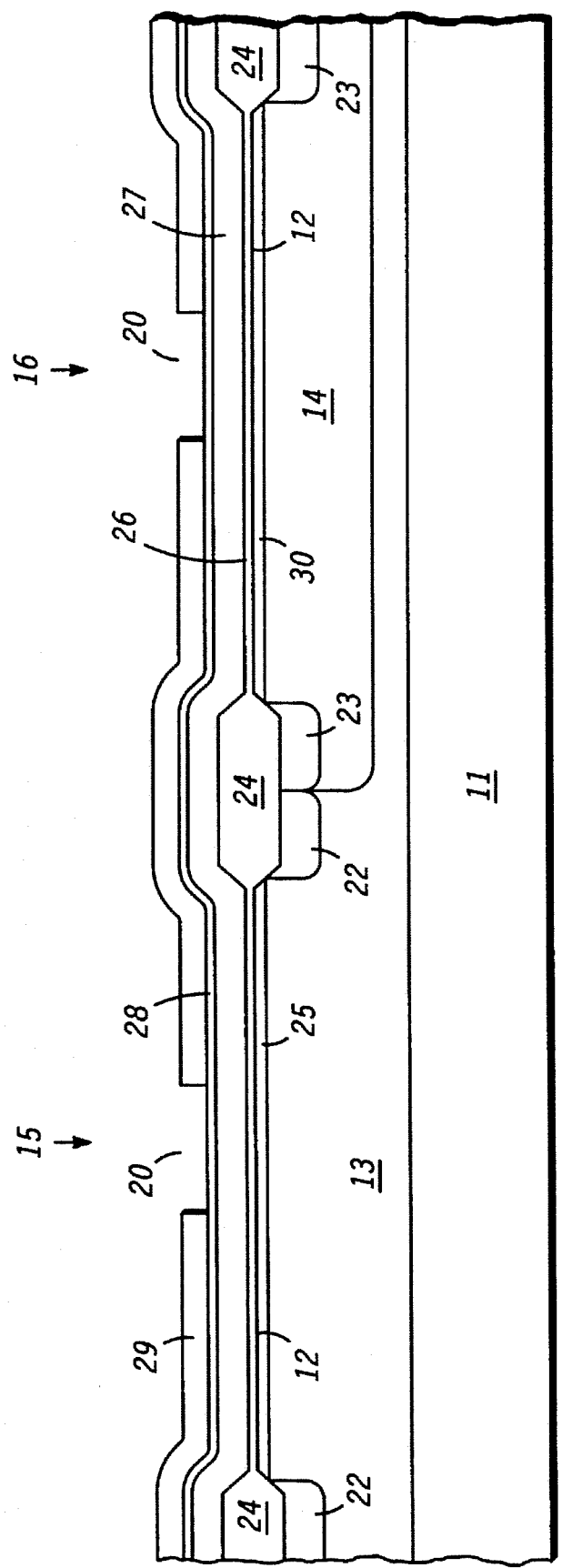
FIGS. 1–9 illustrate highly enlarged cross-sectional views of a portion of an insulated gate semiconductor device during processing in accordance with a first embodiment of the present invention.

Generally, the present invention provides an insulated gate semiconductor device and a method of fabricating or forming the insulated gate semiconductor device. Insulated gate semiconductor devices are also referred to as insulated gate field effect devices and insulated gate field effect transistors. The insulated gate semiconductor devices manufactured in accordance with the present invention comprise new and novel L-shaped gate structures. More particularly, the L-shaped gate structures include a gate contact portion from which a gate extension protrudes or extends. The gate extension serves as the active portion of the gate structure, whereas the gate contact portion provides a means for electrically contacting the active gate portion. In addition, the bandwidth of the insulated gate field effect transistors is increased by thickening a portion of the gate oxide adjacent the drain region of the insulated gate field effect transistors.

It should be understood that the same reference numerals are used in the figures to denote the same elements. It shall be further understood that the materials, concentrations, and thicknesses provided in the description of the present invention merely serve as examples and are not limitations of the present invention.

FIG. 1 illustrates an enlarged cross-sectional view of a portion of partially completed complementary insulated gate field effect transistors 10 during processing in accordance with a first embodiment of the present invention. Complementary insulated gate field effect transistors 10 include an N-channel transistor 15 fabricated in a portion of a P-type epitaxial layer 13 and a P-channel transistor 16 fabricated in a portion of an N-well 14. What is shown in FIG. 1 is a semiconductor substrate 11 of P conductivity type having an epitaxial layer 13 disposed thereon. By way of example, epitaxial layer 13 is of P conductivity type, has a major surface 12, and ranges in thickness from approximately 2 microns (µm) to approximately 5 µm. Using methods known in the art, an impurity well 14 of N conductivity type is formed in a portion of P-type epitaxial layer 13. By way of example, substrate 11 has a resistivity ranging from approximately 0.01 ohm-centimeter (Ω-cm) to approximately 0.1 Ω-cm, and P-type epitaxial layer 13 has a resistivity between approximately 6 Ω-cm and approximately 8 Ω-cm. P-type epitaxial layer 13 and N-well 14 have a surface concentration on the order of $5 \times 10^{15}$ atoms per cubic centimeter (atoms/cm$^3$). Although the description of the present invention uses the combination of semiconductor substrate 11 and epitaxial layer 13 to prevent latch-up, it should be understood that insulated gate field effect transistors in accordance with the present invention may be manufactured in a semiconductor material such as substrate 11. In addition, field implant regions 22 are formed in epitaxial layer 13, field implant regions 23 are formed in N-well 14, and field oxide regions 24 are formed over field implant regions 22 and 23. Formation of epitaxial layers, dopant wells, field implant regions, and field oxide regions are well known to those skilled in the art.

An implant block mask (not shown) such as, for example, photoresist, is formed over N-well 14 and an impurity material of N conductivity type is implanted into a portion of P-type epitaxial layer 13 to form a dopant layer 25 between two adjacent field oxide regions 24. Although dopant layer 25 is shown as extending across an entire portion of P-type epitaxial layer 13 between adjacent field oxide regions 24, it should be understood that dopant layer 25 may be formed to extend across a subportion of the P-type epitaxial layer 13 that is between adjacent field oxide regions 24. The implant block mask is removed and another implant block mask is formed on the P-type epitaxial layer 13. An impurity material of P conductivity type is implanted into a portion of N-well 14 to form a dopant layer 30 between two adjacent field oxide regions 24. Similar to dopant layer 25, dopant layer 30 may be formed to extend across a subportion of N-well 14. It should be noted that dopant layers 25 and 30 serve as drain extension regions for field effect transistors 15 and 16 manufactured in P-type epitaxial layer 13 and N-well 14, respectively. Further, dopant layers 25 and 30 permit the formation of a portion of the gate oxide layer to be sufficiently thick to reduce the gate to drain capacitance, thereby improving the frequency response of the field effect transistors.

By way of example, layers 25 and 30 have a surface concentration ranging from approximately $7 \times 10^{16}$ atoms/$cm^3$ to approximately $2 \times 10^{17}$ atoms/$cm^3$. A suitable set of implant conditions to obtain the aforementioned surface concentration includes: an implant dose ranging from approximately $1 \times 10^{12}$ atoms per square centimeter (atoms/$cm^2$) to approximately $3 \times 10^{12}$ atoms/$cm^2$ for both layers 25 and 30; an implant energy for forming dopant layer 25 ranging from approximately 50 kilo-electron volts (KeV) to approximately 200 KeV; and an implant energy for forming dopant layer 30 ranging from approximately 25 KeV to approximately 100 KeV.

A layer of dielectric material 26, which serves as a gate oxide layer, is formed on major surface 12 and on field oxide regions 24. Suitable techniques for forming gate oxide layer 26 include thermal oxidation, chemical vapor deposition, and the like. Although some oxidation procedures increase the thickness of field oxide regions 24 during the formation of oxide layer 26, to simplify the description of the present invention and because the increase in thickness is small relative to the overall thickness of field oxide regions 24, the increase in the thickness of field oxide regions 24 is not shown. In accordance with the first embodiment of the present invention, gate oxide layer 26 has a thickness ranging between approximately 50 angstroms and approximately 150 angstroms and a nominal thickness of 70 angstroms. It should be noted that if the semiconductor device is manufactured in a semiconductor material such as substrate 11, then gate oxide layer 26 is formed on substrate 11.

A layer of polysilicon 27 is formed on oxide layer 26 using, for example, a chemical vapor deposition technique. A suitable range of thicknesses for polysilicon layer 27 is between approximately 400 angstroms and approximately 1,000 angstroms. An insulating masking layer 28 having a thickness ranging between approximately 300 angstroms and approximately 700 angstroms is formed on polysilicon layer 27. It should be understood that layer 27 is not limited to polysilicon but may include silicon or the like. By way of example, insulating masking layer 28 is an oxide layer formed by the decomposition of tetraethyl orthosilicate. A layer of photoresist 29, having openings 20, is formed on oxide layer 28, wherein openings 20 expose portions of oxide layer 28.

Figure 2:
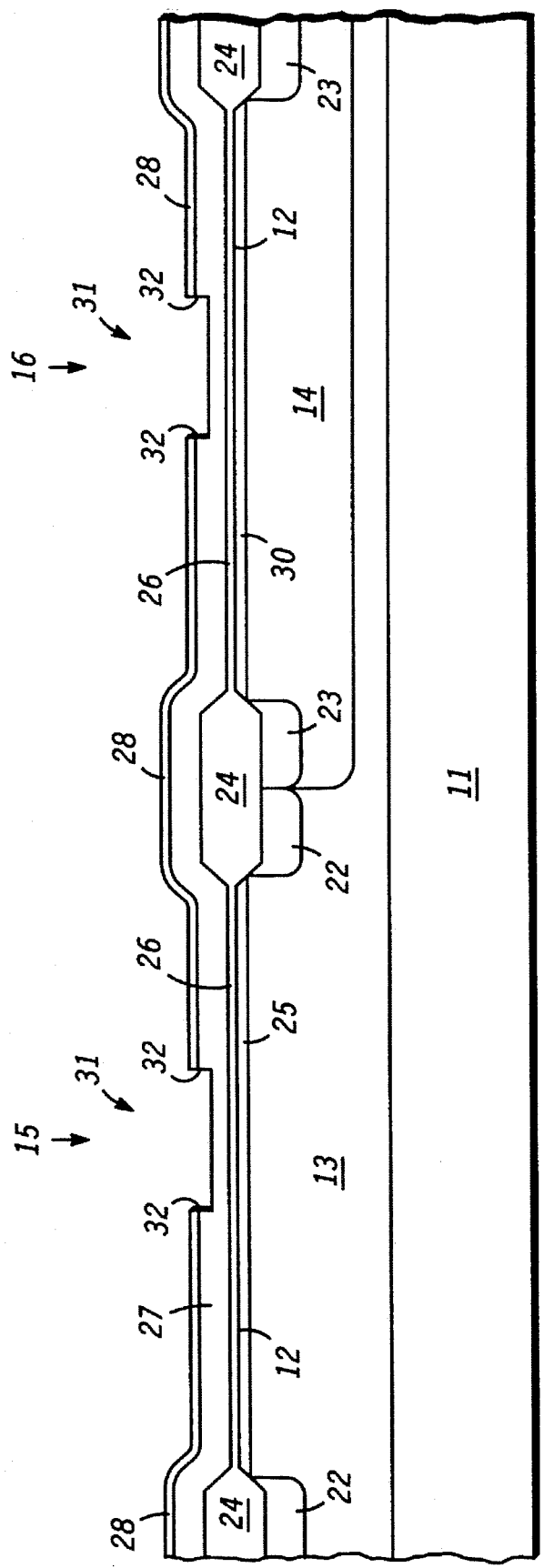

Now referring to FIG. 2, the exposed portions of oxide layer 28 are anisotropically etched to form openings 31, having sides 32, which expose portions of polysilicon layer 27. Typically, the anisotropic etch step is performed using a reactive ion etch (RIE). For insulating masking layer 28 being oxide, a suitable etching species is $CF_6$. It should be noted that an overetch commonly occurs when etching through an insulating material disposed on a semiconductor material such as, for example, silicon or polysilicon. Thus, openings 31 extend into polysilicon layer 27, thereby exposing a portion of polysilicon layer 27. Although openings 31 are shown as extending into polysilicon layer 27, it should be understood that this is not a limitation of the present invention and that openings 31 may stop on polysilicon layer 27. The remaining portions of layer of photoresist 29 are removed.

Figure 3:
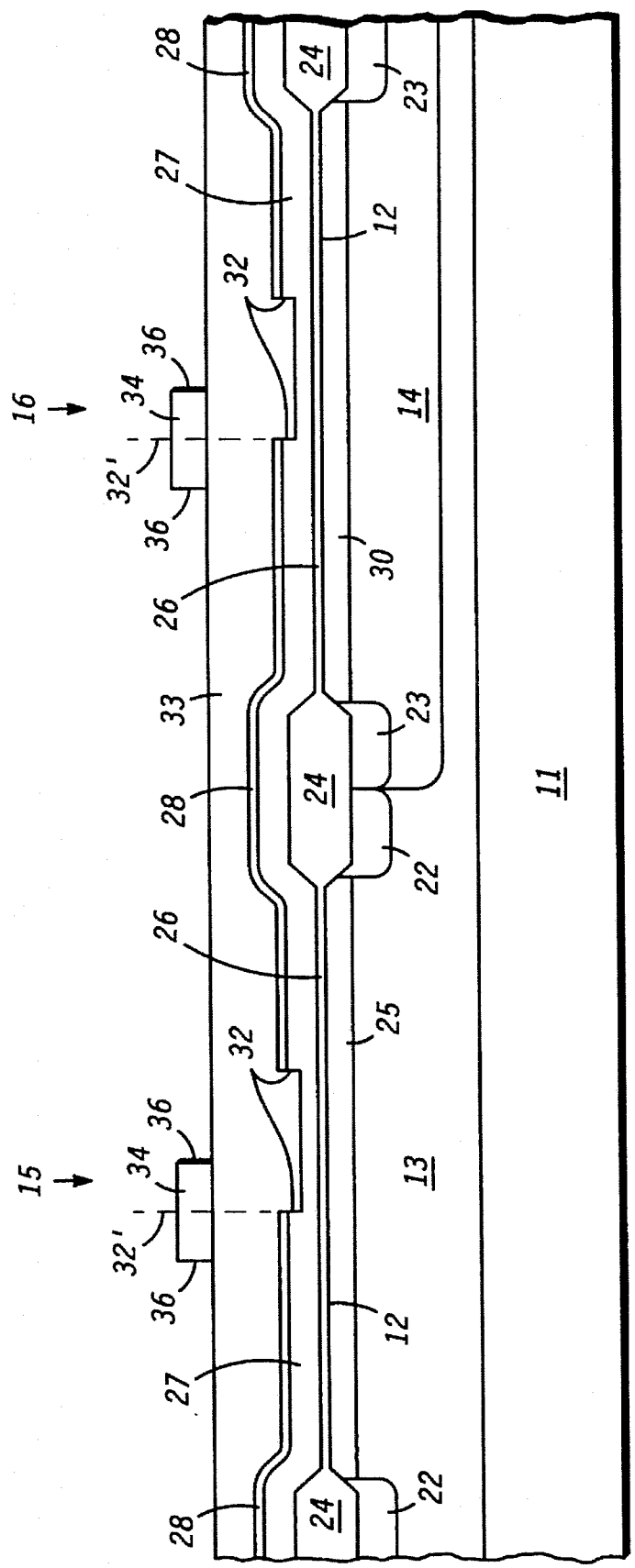

Now referring to FIG. 3, a layer of polysilicon 33 is conformably deposited on insulating masking layer 28 and the exposed portions of polysilicon layer 27, thereby filling openings 31 (FIG. 2). A suitable thickness range for polysilicon layer 33 is between approximately 3,000 angstroms and approximately 6,000 angstroms. It should be noted that since polysilicon layer 33 is a conformal layer, notches (not shown) are typically formed in polysilicon layer 33; however, to simplify the description of the present invention the notches have been omitted from FIG. 3. In other words, it should be understood that, typically, the surface of polysilicon layer 33 is not planar, but it is shown as being planar merely for the sake of simplifying the description of the present invention. It should be further understood that layer 33 is not limited to polysilicon but may include silicon or the like.

A layer of photoresist is deposited on polysilicon layer 33 and patterned to form etch protection structures 34. Each etch protection structure 34 has sides 36. More particularly, etch protection structures 34 are patterned such that a side 32 of each opening 31 is between the sides 36 of an etch protection structure 34. In other words, an etch protection structure 34 straddles a side 32 of an opening 31. To further illustrate the positioning of etch protection structures 34, broken lines 32' are shown in FIG. 3 as extending from a side 32 and through an etch protection structure 34, wherein the broken lines are between sides 36 of an etch protection structure 34. As those skilled in the art are aware, layers 25 and 30 diffuse into P-type epitaxial layer 13 and N-well 14, respectively, during the manufacture of transistors 15 and 16.

Figure 4:
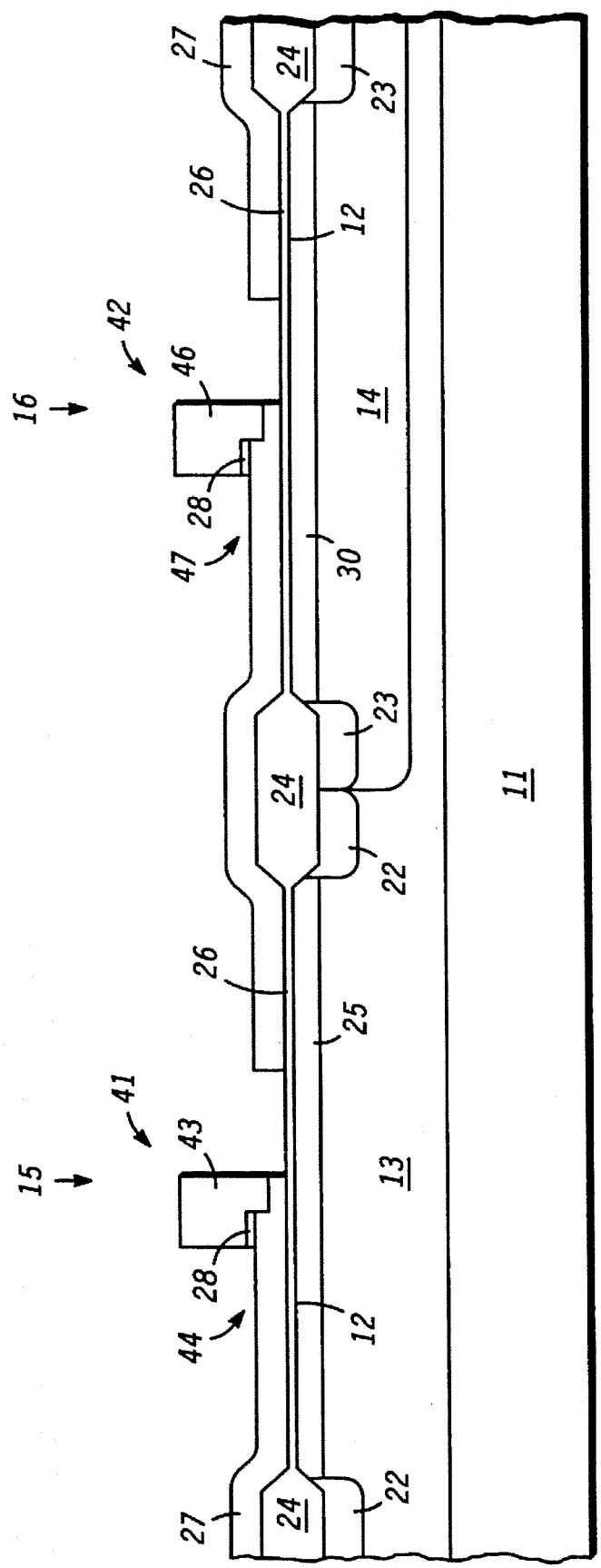

Now referring to FIG. 4, polysilicon layers 33 and 27 are etched to form a plurality of L-shaped gate structures 41 and 42. L-shaped gate structure 41 includes a gate contact portion 43 and a gate extension portion 44, whereas L-shaped gate structure 42 includes a gate contact portion 46 and a gate extension portion 47. It should be understood that gate contact portions 43 and 46 are formed from polysilicon layer 33 and gate extension portions 44 and 47 are formed from polysilicon layer 27. By way of example, L-shaped gate structures 41 and 42 are formed using a two-step etch process to selectively etch polysilicon layer 33. In a first etch step, the etch chemistries are selected to terminate on insulating masking layer 28. In a second etch step, the etch chemistries are selected to etch through the portions of polysilicon layer 33 unprotected by etch protection structures 34 (shown in FIG. 3). Thus, the etchant of the second etch step is selected to etch polysilicon faster than oxide. Preferably the first and second etch steps are anisotropic etches that do not significantly penetrate gate oxide layer 26, thereby precluding etching into P-type epitaxial layer 13.

In accordance with the first embodiment of the present invention, the first and second etch steps are performed using anisotropic reactive ion etching (RIE) and an etchant species that is selective for polysilicon. Suitable etchant species include a mixture of sulfur hexafluoride ($SF_6$) and chlorine ($Cl_2$), a mixture of dichlorodifluoro-methane ($CCl_2F_2$) and $Cl_2$, or the like. It should be understood that the etchant species for the first and second etch steps are selected such that the etch rate of the first step is higher than the etch rate of the second step. Thus, a suitable etchant species for the second etch step is chlorine. Methods for etching polysilicon using reactive ion etching are well known to those skilled in the art. The portions of insulating masking layer 28 and the portions of gate oxide layer 26, i.e., the exposed portions of layers 28 and 26, not covered by polysilicon are removed.

Figure 5:
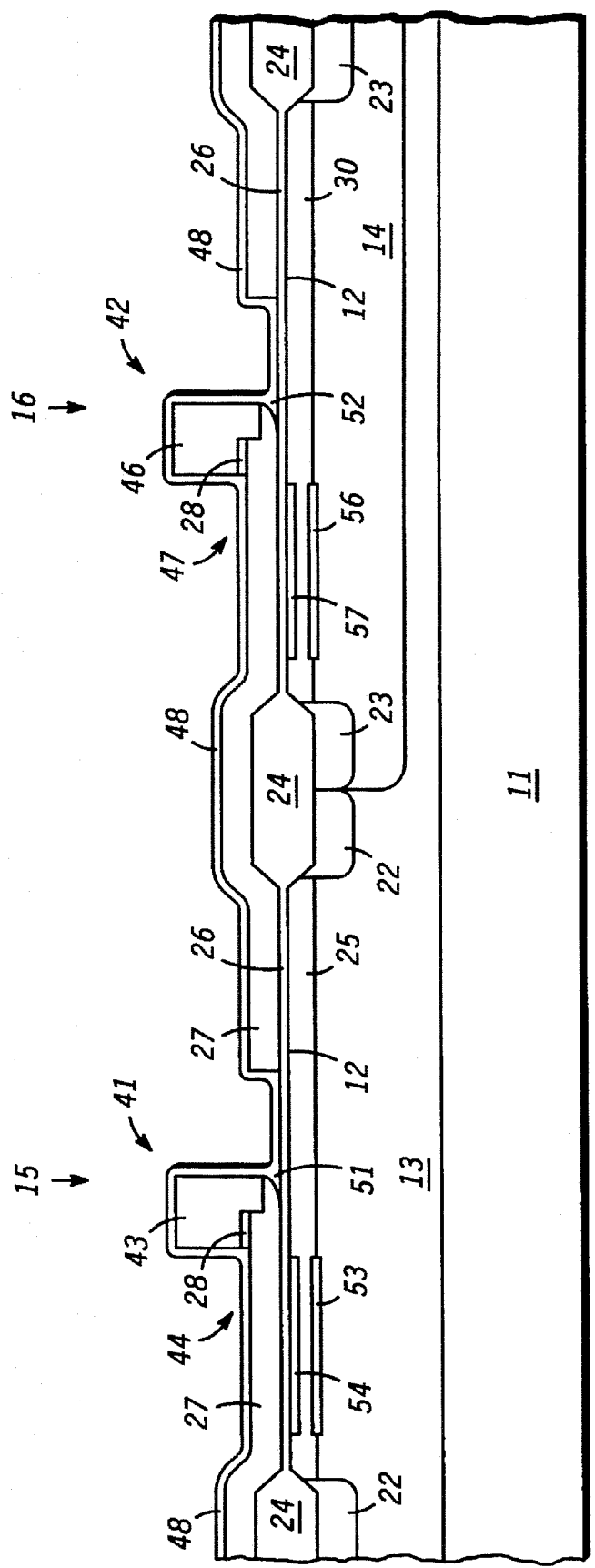

Now referring to FIG. 5, a layer of oxide 48 having a thickness ranging between approximately 100 angstroms and approximately 300 angstroms is formed on the exposed portions of P-type epitaxial layer 13, the exposed portions of N-well 14, the exposed portions of layer of polysilicon 27, and on gate contact portions 43 and 46. A nominal thickness for oxide layer 48 is approximately 200 angstroms. Oxide layer 48 lowers a gate to drain capacitance of N-channel transistor 15 by increasing a thickness of a portion 51 of gate oxide layer 26 between major surface 12 and gate contact portion 43. In other words, the potion of gate oxide layer 26 which is on the drain side of gate structure 41 and between major surface 12 and gate contact portion 43 is thickened. Likewise, a gate to drain capacitance of P-channel transistor 16 is lowered by increasing a thickness of a portion 52 of gate oxide layer 26 between major surface 12 and gate contact portion 46. In other words, the portion of gate oxide layer 26 which is on the drain side of gate structure 42 and between major surface 12 and gate contact portion 46 is thickened. The lower gate to drain capacitance enhances the high frequency performance of complementary transistors 10 while simultaneously increasing their drain to source breakdown voltage. In addition, oxide layer 48 serves as a screen mask to protect polysilicon layer 27, gate contact portions 43 and 46, and substrate 11 from ion implant damage.

Still referring to FIG. 5, a layer of photoresist (not shown) is formed on the portions of oxide layer 48 on gate contact portion 43, the portions of oxide layer 48 on major surface 12 adjacent the drain side of gate structure 41, and over N-well 14, including gate contact portion 46 and gate extension 44. The layer of photoresist serves as an implant block mask to prevent impurity materials from being implanted into the portion of P-type epitaxial layer 13 on a drain side of gate structure 41, N-well 14, and gate structure 42. In accordance with the first embodiment, an enhanced dopant region 53 is formed by doping a portion of P-type epitaxial layer 13 with an impurity material of P conductivity type such as, for example, boron. More particularly, the boron is implanted into a portion of P-type epitaxial layer 13 to form enhanced dopant region 53, wherein the enhanced dopant region 53 is aligned to the source side of gate structure 41. It should be noted that enhanced dopant region 53 is spaced apart from surface 12 and has a higher concentration of boron than P-type epitaxial layer 13; thus, dopant region 53 is referred to as an enhanced dopant region. A suitable set of implant parameters includes implanting the boron at a dose ranging between approximately $2 \times 10^{12}$ atoms/cm$^2$ and approximately $2 \times 10^{13}$ atoms/cm$^2$ and at an implant energy ranging between approximately 40 KeV and approximately 100 KeV. Thus, the boron forming enhanced dopant region 53 is implanted into P-type epitaxial layer 13 on the source side of gate structure 41 at a depth or distance ranging between approximately 1,500 and approximately 3,000 angstroms. The impurity materials or dopant forming enhanced dopant region 53 serves to provide punch-through protection for N-channel transistor 15.

An enhanced dopant region 54 is formed by doping another portion of P-type epitaxial layer 13 with boron, wherein the enhanced dopant region 54 is aligned to the source side of gate structure 41. By way of example, implant parameters for the formation of enhanced dopant region 54 include a dose ranging between approximately $5 \times 10^{11}$ atoms/cm$^2$ and approximately $1 \times 10^{13}$ atoms/cm$^2$ and a suitable implant energy ranging between approximately 10 KeV and approximately 20 KeV. Thus, the boron forming enhanced dopant region 54 is implanted into a portion of P-type epitaxial layer 13 to a depth or distance ranging between approximately 200 and approximately 1,200 angstroms. Since dopant region 54 has a higher concentration of boron than P-type epitaxial layer 13, it is referred to as an enhanced dopant region. The impurity materials forming enhanced dopant region 54 serve to adjust the threshold voltage of N-channel transistor 15. The layer of photoresist is removed and another layer of photoresist (not shown) is formed on the portions of oxide layer 48 on gate contact portion 46, the portions of oxide layer 48 on major surface 12 adjacent gate structure 42, and over P-type epitaxial layer 13, including gate contact portion 43 and gate extension 44.

The layer of photoresist serves as an implant block mask to prevent impurity materials from being implanted into the portion of N-well 14 on the drain side of gate structure 42, P-type epitaxial layer 13, and gate structure 41. In accordance with the first embodiment, an enhanced dopant region 56 is formed by doping a portion of N-well 14 with an impurity material of N conductivity type such as, for example, phosphorus. More particularly, the phosphorus is implanted into N-well 14 to form enhanced dopant region 56, wherein the enhanced dopant region 56 is aligned to the source side of gate structure 42. It should be noted that enhanced dopant region 56 is spaced apart from surface 12 and has a higher concentration of phosphorus than N-well 14; thus, dopant region 56 is referred to as an enhanced dopant region. A suitable set of implant parameters includes implanting the phosphorus at a dose ranging between approximately $2 \times 10^{12}$ atoms/cm$^2$ and approximately $2 \times 10^{13}$ atoms/cm$^2$ at an implant energy ranging between approximately 80 KeV and approximately 200 KeV. Thus, the phosphorus forming enhanced dopant region 56 is implanted into N-well 14 to depth or distance ranging between approximately 1,500 and approximately 3,000 angstroms. The implant forming enhanced dopant region 56 serves to provide punch-through protection for P-channel transistor 16.

An enhanced dopant region 57 is formed by doping another portion of N-well 14 with phosphorus. By way of example, the phosphorus is implanted into N-well 14 to form dopant region 57, wherein the enhanced dopant region 57 is aligned to the source side of gate structure 42. Suitable implant parameters for the formation of enhanced dopant region 57 include a dose ranging between approximately $5 \times 10^{11}$ atoms/cm$^2$ and approximately $1 \times 10^{13}$ atoms/cm$^2$ and a suitable implant energy ranging between approximately 20 KeV and approximately 40 KeV. Thus, the phosphorus forming enhanced dopant region 57 is implanted into N-well 14 to a depth or distance ranging between approximately 200 and 1,200 angstroms. Since dopant region 57 has a higher concentration of phosphorus than N-well 14, it is referred to as an enhanced dopant region. The impurity materials forming enhanced dopant region 57 serve to adjust the threshold voltage of P-channel transistor 16. The layer of photoresist is removed.

Figure 6:
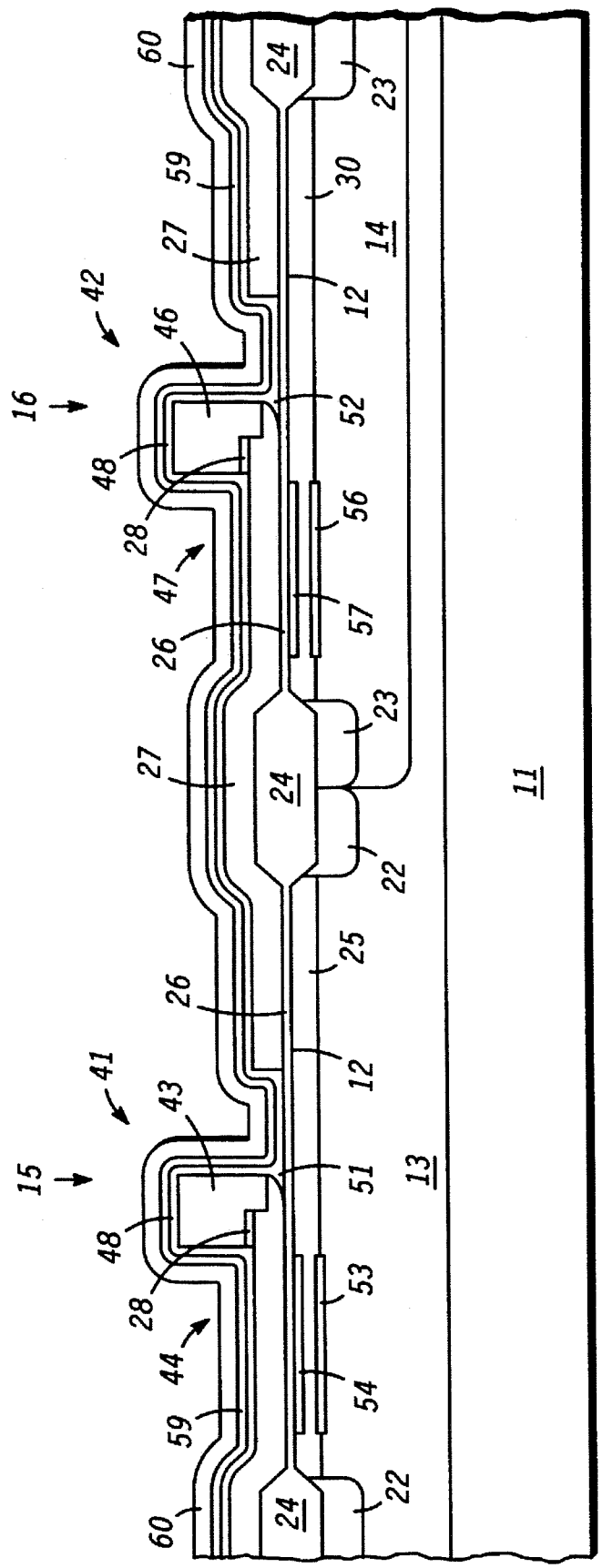

Now referring to FIG. 6, a conformal layer of insulating material 59 is formed on oxide layer 48. By way of example, conformal layer of insulating material 59 is silicon nitride having a thickness up to approximately 2,250 angstroms. It should be understood that including layer 59 is optional, however layer 59 prevents etch pitting of major surface 12 in, for example, surface topologies used in multiple input gate configurations. A nominal thickness of silicon nitride layer 59 is 750 angstroms. After formation of silicon nitride layer 59, a conformal layer of insulating material 60 is formed on silicon nitride layer 59. A suitable material for insulating material 60 is oxide formed by the decomposition of tetraethyl orthosilicate. The thickness of oxide layer 60 ranges up to approximately 2,250 angstroms with a nominal thickness of 1,000 angstroms. It should be noted that during the formation of layers 59 and 60, the impurity materials of enhanced dopant regions 53, 54, 56, and 57 diffuse into P-type epitaxial layer 13 and N-well 14, respectively. It should be further noted that in place of the combination-of layers 59 and 60 a single layer of silicon nitride or a single layer of oxide may be used.

Figure 7:
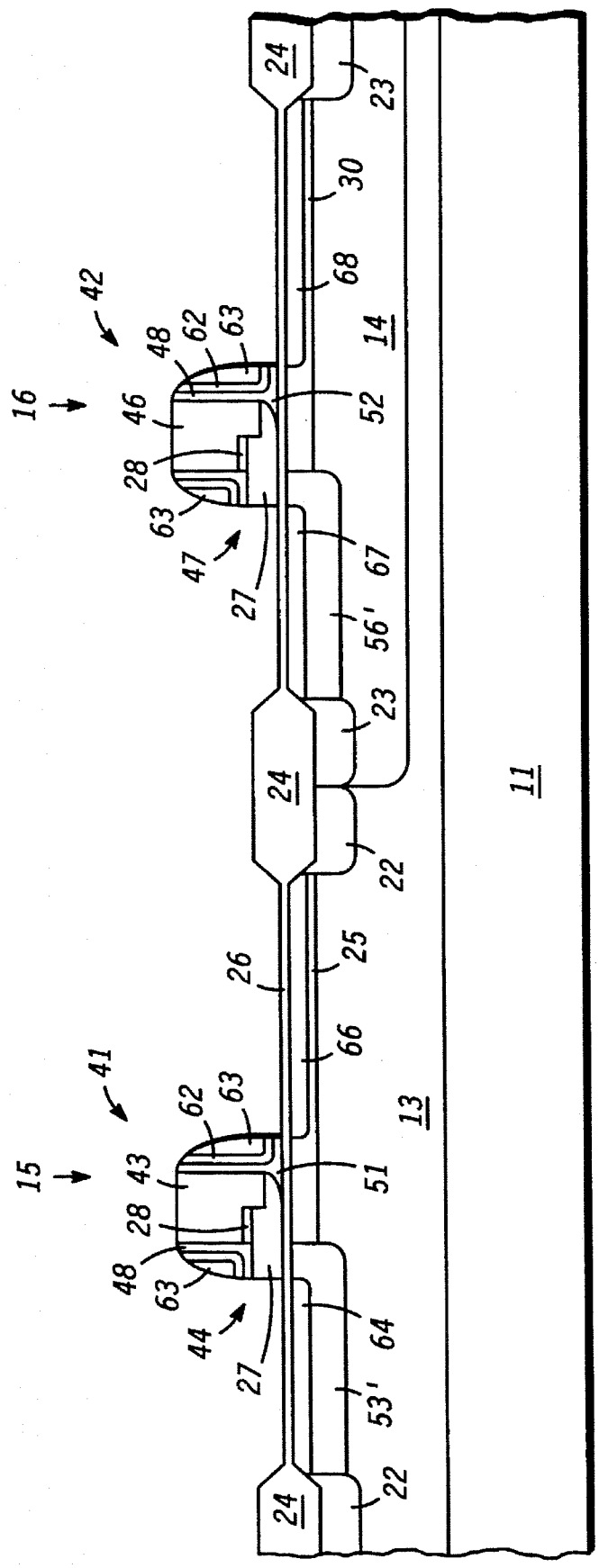

Now referring to FIG. 7, conformal layers 60 and 59 are anisotropically etched to form sidewall spacers 63 and 62, respectively. After forming spacers 63 and 62, oxide layer 48 is anisotropically etched to expose the portions of polysilicon layer 27 that are not under gate contact portions 43 and 46 and under spacers 63 and 62. The portions of polysilicon layer 27 exposed by the anisotropic etching step are removed by another anisotropic etch to expose portions of gate oxide layer 26. Thus, each L-shaped gate structure 41 and 42 has first, second, and third sides, wherein the second side is between the first and third sides.

Still referring to FIG. 7, a layer of photoresist (not shown) is formed on gate structure 42, the exposed portions of gate oxide layer 26 on major surface 12 of N-well 14 and the exposed portions of major surface 12 of N-well 14. The layer of photoresist serves as an implant block mask to define the source and drain regions of P-type epitaxial layer 13, i.e., the source and drain regions of N-channel transistor 15. It should be noted that an implant block mask is not formed on gate structure 41, thereby allowing doping of gate structure 41 during the source/drain implant. In other words, the layer of photoresist serves as an implant block mask to prevent impurity materials from being implanted into N-well 14 and gate structure 42. A source/drain implant is performed to form a source region 64 and a drain region 66. In addition, the source/drain implant dopes gate structure 41. A suitable set of implant parameters for the source/drain implant includes implanting an N type impurity material such as arsenic, at a dose ranging between approximately $1 \times 10^{15}$ atoms/cm$^2$ and approximately $1 \times 10^{16}$ atoms/cm$^2$, and a suitable implant energy ranging between approximately 60 KeV and approximately 160 KeV.

The layer of photoresist is removed and another layer of photoresist is formed on gate structure 41, the exposed portions of gate oxide layer 26 on major surface 12 of P-type epitaxial layer 13 and the exposed portions of major surface 12 of P-type epitaxial layer 13. The layer of photoresist serves as an implant block mask to define the source and drain regions of N-well 14, i.e., the source and drain regions of P-channel transistor 16. It should be noted that an implant block mask is not formed on gate structure 42, thereby allowing doping of gate structure 42 during the source/drain implant. In other words, the layer of photoresist serves as an implant block mask to prevent impurity materials from being implanted into P-type epitaxial layer 13 and gate structure 41. A source/drain implant is performed to form a source region 67 and a drain region 68. In addition, the source/drain implant further dopes gate structure 42. A suitable set of implant parameters for the source/drain implant includes implanting a P type impurity material such as boron, at a dose ranging between approximately $1 \times 10^{15}$ atoms/cm$^2$ and approximately $5 \times 10^{15}$ atoms/cm$^2$ and a suitable implant energy ranging between approximately 5 KeV and approximately 15 KeV. The layer of photoresist is removed. Although enhanced dopant regions 53 and 54 are initially spaced apart, it should be noted that they diffuse towards each other and form a single enhanced dopant region 53'. Likewise, enhanced dopant regions 56 and 57 diffuse towards each other and form a single enhanced dopant region 56'.

Figure 8:
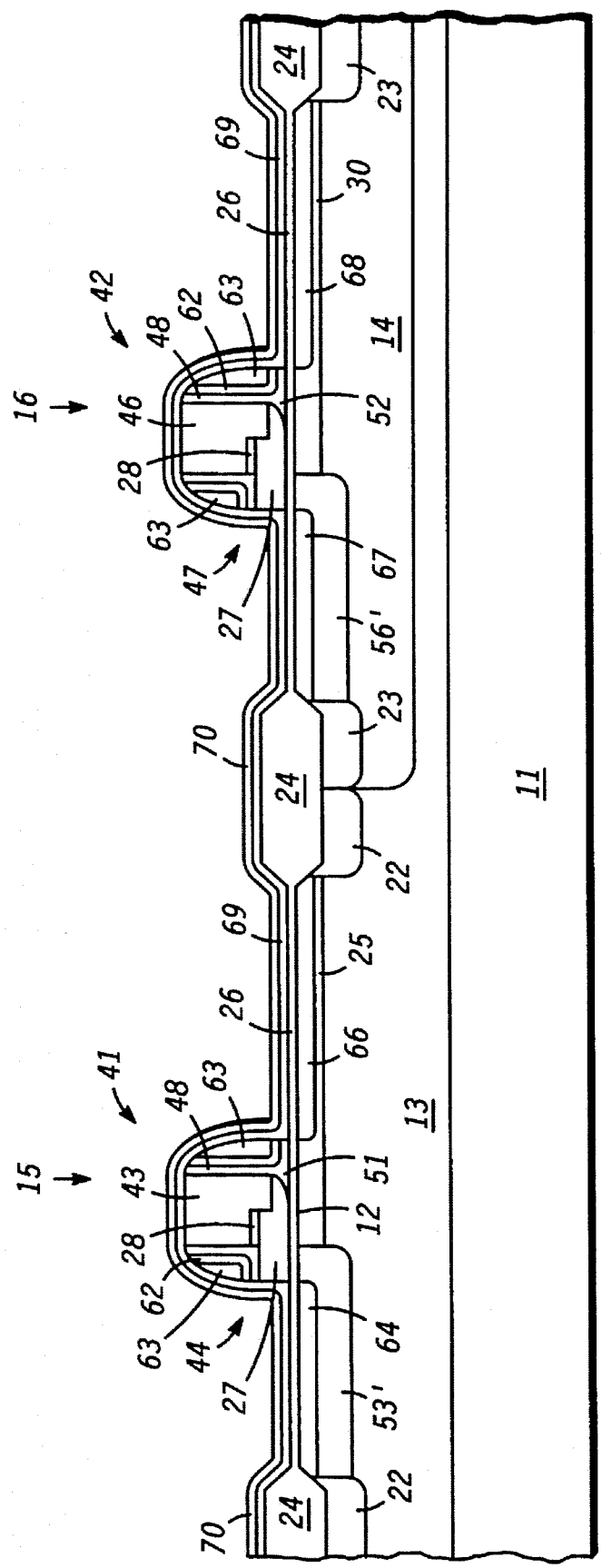

Now referring to FIG. 8, a conformal layer of insulating material 69 is formed on the exposed portions of layer of gate oxide 26, spacers 63, the exposed portions of oxide layer 48, and on gate structures 41 and 42. By way of example, conformal layer of insulating material 69 is silicon nitride having a thickness ranging between approximately 500 angstroms and approximately 2,250 angstroms. A nominal thickness of silicon nitride layer 69 is 750 angstroms. Optionally, after formation of silicon nitride layer 69, a conformal layer of insulating material 70 is formed on silicon nitride layer 69. A suitable material for insulating material 70 is oxide formed by the decomposition of tetraethyl orthosilicate. Layer of insulating material 70 may have a thickness of up to 1,000 angstroms with a nominal thickness of 750 angstroms.

Figure 9:
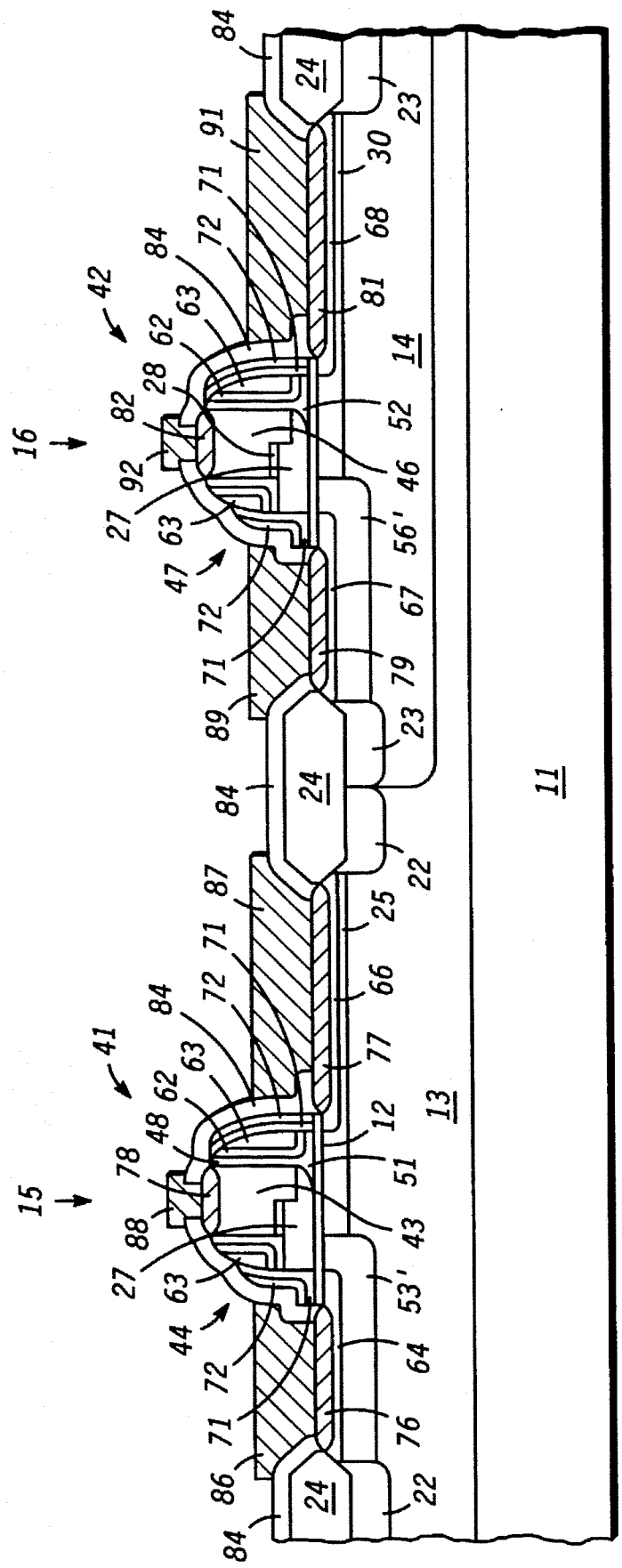

Now referring to FIG. 9, oxide layer 70 and silicon nitride layer 69 are anisotropically etched to form oxide spacers 72 and nitride spacers 71 adjacent spacers 63. In addition, the anisotropic etch step exposes the portions of major surface 12 adjacent oxide spacers 72 as well as gate contact portions 43 and 46 of gate structures 41 and 42, respectively. A silicide 76 is formed on dopant region 64, a silicide 77 is formed on dopant region 66, a silicide 78 is formed on the exposed portions of gate structure 41, a silicide 79 is formed on dopant region 66, a silicide 81 is formed on dopant region 67, and a silicide 82 is formed on the exposed portions of gate structure 42.

A layer of dielectric material 84, such as, for example, oxide is formed on field oxide regions 24, spacers 72 and silicide 76, 77, 78, 79, 81, and 82. Openings (not shown) are formed in oxide 84 to expose portions of silicide 76, 77, 78, 79, 81, and 82. Using techniques well known in the art, electrical conductors or electrodes are formed which contact the exposed silicide. More particularly, a source conductor 86 contacts silicide 76, a drain conductor 87 contacts silicide 77, and a gate conductor 88 contacts silicide 78. Thus, source, drain, and gate conductors 86, 87, and 88, respectively, form conductors for N-channel transistor 15. Likewise, a source conductor 89 contacts silicide 79, a drain conductor 91 contacts silicide 81, and a gate conductor 92 contacts silicide 82. Thus, source, drain, and gate conductors 89, 91, and 92, respectively, form electrical conductors for P-channel transistor 16. It should be understood that gate conductors 88 and 92 are illustrated for the sake of completeness. More particularly, those skilled in the art are aware that gate structures 41 and 42 are very small and are typically contacted by extending them to a contact pad.

FIGS. 10–18 illustrate highly enlarged cross-sectional views of a portion of complementary insulated gate semiconductor devices 100 during processing in accordance with a second embodiment of the present invention. Complementary insulated gate field effect transistors 100 include an N-channel transistor 115 fabricated in a portion of a P-type epitaxial layer 13 and a P-channel transistor 116 fabricated in a portion of an N-well 14. Formation of P-type epitaxial layer 13, N-well 14, field oxide regions 24, and field implant regions 22 and 23 are described with reference to FIG. 1.

Figure 10:
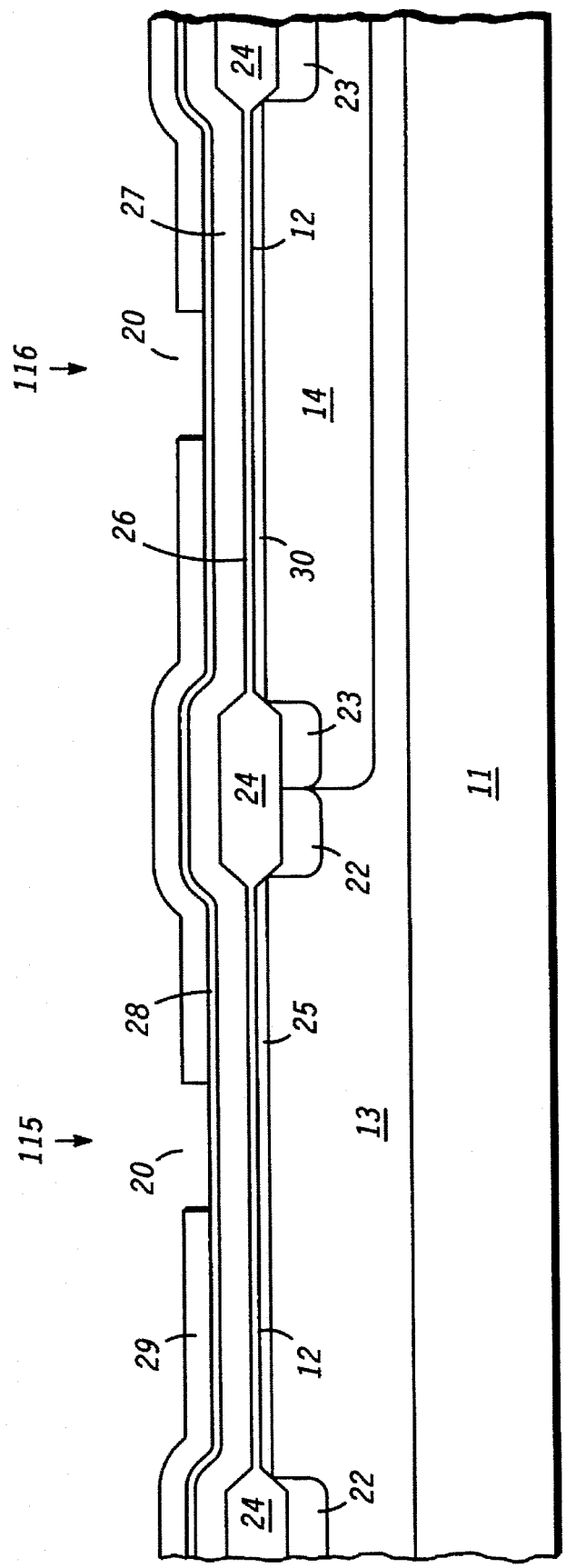
FIGS. 10–18 illustrate highly enlarged cross-sectional views of a portion of an insulated gate semiconductor device during processing in accordance with a second embodiment of the present invention.

Now referring to FIG. 10, a layer of dielectric material 26, which serves as a gate oxide layer, is formed on major surface 12 and on field oxide regions 24. Suitable techniques for forming gate oxide layer 26 include thermal oxidation, chemical vapor deposition, and the like. It should be noted that the thickness of field oxide regions 24 also increases during the formation of oxide layer 26; however, since the increase in thickness is small relative to the overall thickness of field oxide regions 24 and to simplify the description of the present invention, the portions of oxide layer 26 on field oxide regions 24 are not shown. In accordance with the second embodiment of the present invention, gate oxide layer 26 has a thickness ranging between approximately 50 angstroms and approximately 150 angstroms and a nominal thickness of 70 angstroms.

A layer of polysilicon 27 is formed on oxide layer 26 using, for example, a chemical vapor deposition technique. A suitable range of thicknesses for polysilicon layer 27 is between approximately 400 angstroms and approximately 1,000 angstroms. An insulating masking layer 28 having a thickness ranging between approximately 300 angstroms and approximately 700 angstroms is formed on polysilicon layer 27. By way of example, insulating masking layer 28 is an oxide layer formed by the decomposition of tetraethyl orthosilicate. A layer of photoresist 29, having openings 20, is formed on oxide layer 28, wherein openings 20 expose portions of oxide layer 28.

Figure 11:
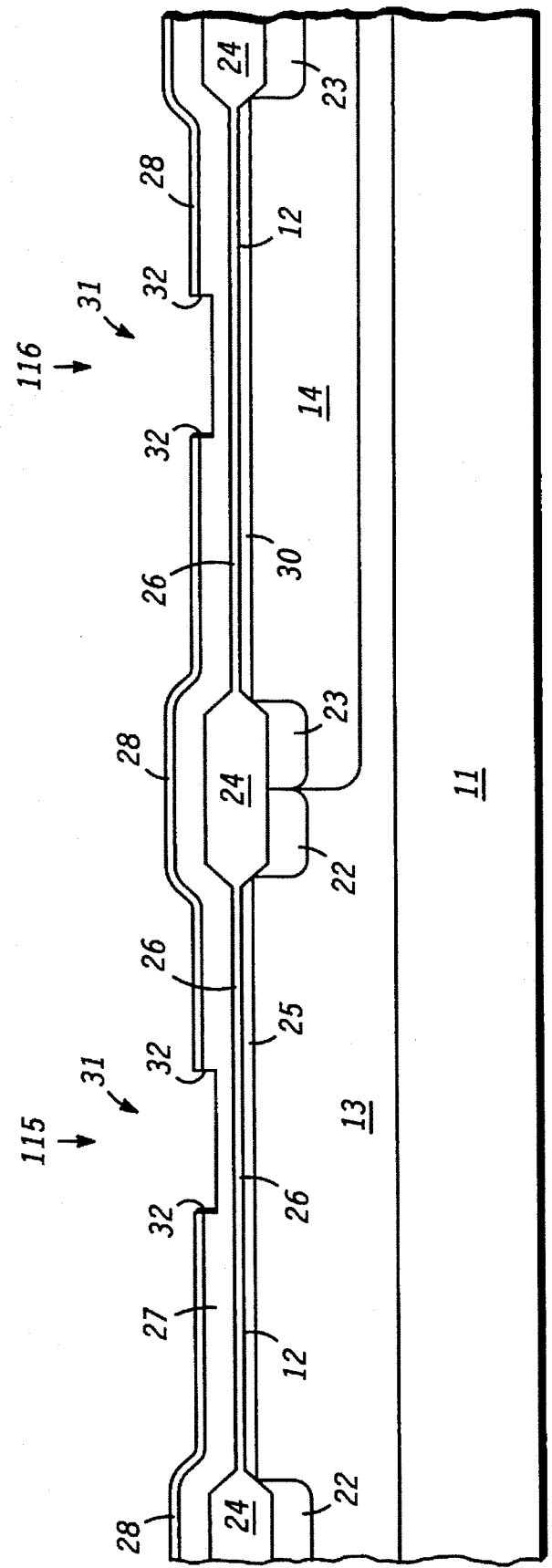

Now referring to FIG. 11, the exposed portions of oxide layer 28 are anisotropically etched to form openings 31, having sides 32, which expose portions of polysilicon layer 27. Typically, the anisotropic etch step is performed using a reactive ion etch (RIE). For insulating masking layer 28 being oxide, a suitable etching species is $CF_6$. It should be noted that an overetch commonly occurs when etching through an insulating material disposed on a semiconductor material such as, for example, silicon or polysilicon. Thus, openings 31 extend into polysilicon layer 27, thereby exposing portions of polysilicon layer 27. Although openings 31 are shown as extending into polysilicon layer 27, it should be understood that this is not a limitation of the present invention and that openings 31 may stop on polysilicon layer 27. The remaining portions of layer of photoresist 29 are removed.

Figure 12:
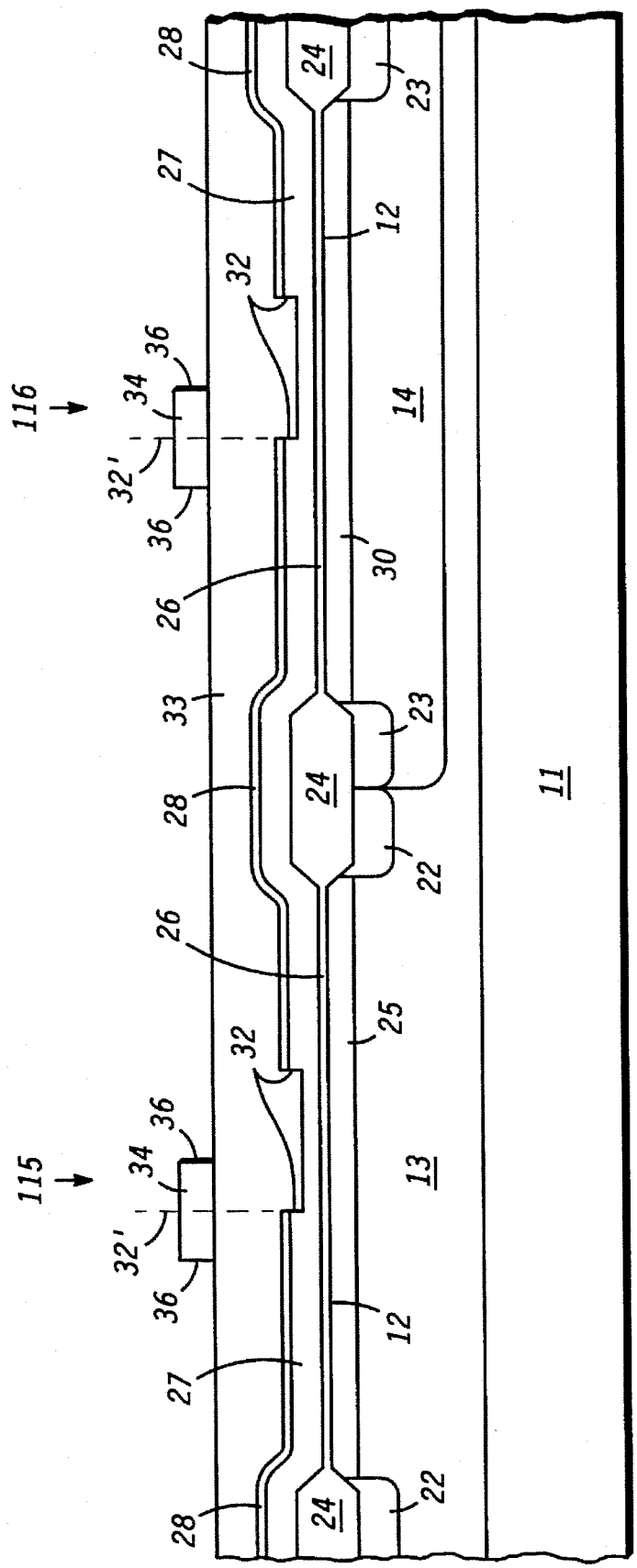

Now referring to FIG. 12, a layer of polysilicon 33 is conformably deposited on insulating masking layer 28 and the exposed portions of layer of polysilicon 27, thereby filling openings 31 (FIG. 11). A suitable thickness range for layer of polysilicon 33 is between approximately 3,000 angstroms and approximately 6,000 angstroms. It should be noted that since layer of polysilicon 33 is a conformal layer, notches (not shown) are typically formed in layer of polysilicon 33; however, to simplify the description of the present invention, the notches have been omitted from FIG. 13. In other words, it should be understood that, typically, the surface of layer of polysilicon 33 is not planar, but it is shown as being planar merely for the sake of simplifying the description of the present invention.

A layer of photoresist (not shown) is deposited on layer of polysilicon 33 and patterned to form etch protection structures 34. Each etch protection structure 34 has sides 36. More particularly, etch protection structures 34 are patterned such that a side 32 of each opening 31 is between the sides 36 of an etch protection structure 34. In other words, an etch protection structure 34 straddles side 32 of opening 31. To further illustrate the positioning of etch protection structures 34, broken lines 32' are shown in FIG. 12 as extending from a side 32 and through an etch protection structure 34, wherein the broken lines are between sidewalls 36 of an etch protection structure 34.

Figure 13:
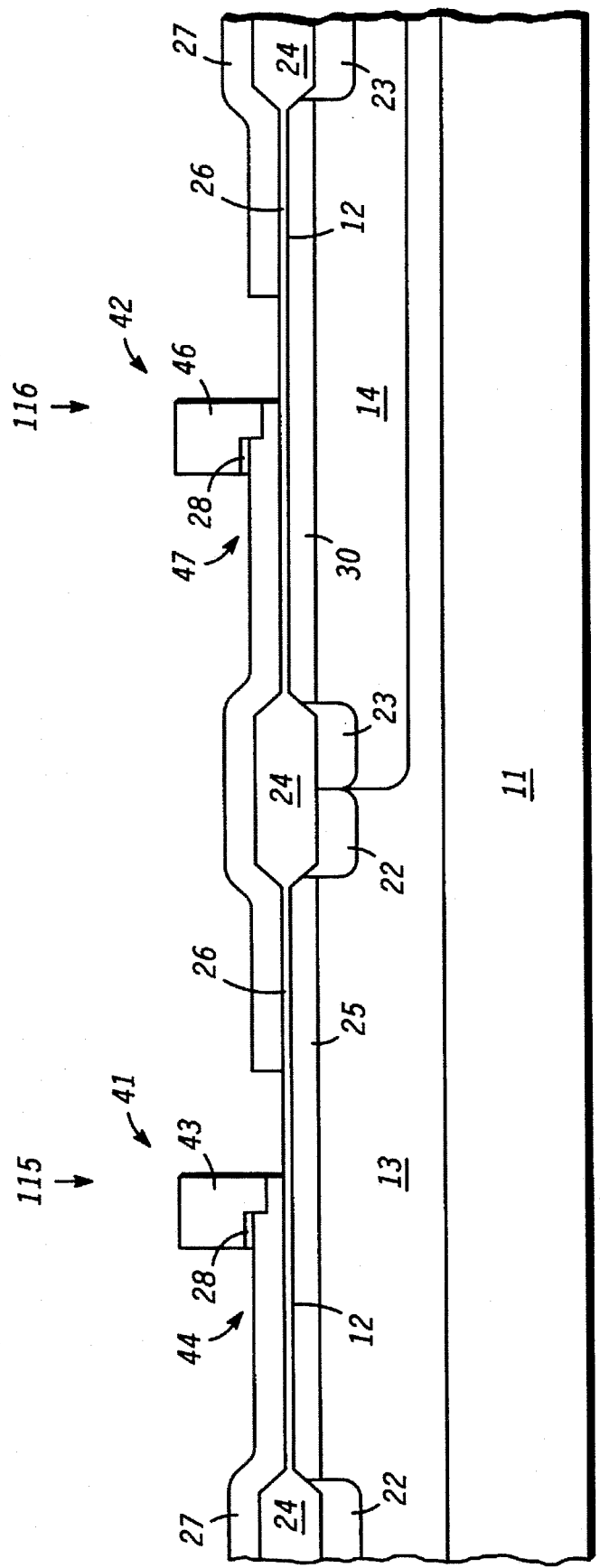

Now referring to FIG. 13, layers of polysilicon 33 and 27 are etched to form a plurality of L-shaped gate structures 41 and 42. L-shaped gate structure 41 includes a gate contact portion 43 and a gate extension portion 44, whereas L-shaped gate structure 42 includes a gate contact portion 46 and a gate extension portion 47. It should be understood that gate contact portions 41 and 42 are formed from layer of polysilicon 33 and gate extension portions 44 and 47 are formed from layer of polysilicon 27. By way of example, L-shaped gate structures 41 and 42 are formed using a two-step etch process to selectively etch layer of polysilicon 33. In a first etch step, the etch chemistries are selected to terminate on insulating masking layer 28. In a second etch step, the etch chemistries are selected to etch through the portions of layer of polysilicon 33 unprotected by etch protection structures 34 (shown in FIG. 12). Thus, the etchant of the second etch step is selected to etch polysilicon faster than oxide. Preferably the first and second etch steps are anisotropic etches that do not significantly penetrate gate oxide layer 26, thereby precluding etching into P-type epitaxial layer 13.

In accordance with an embodiment of the present invention, the first and second etch steps are performed using anisotropic reactive ion etching (RIE) and an etchant species that is selective for polysilicon. Suitable etchant species include a mixture of sulfur hexafluoride ($SF_6$) and chlorine ($Cl_2$), a mixture of dichlorodifluoro-methane ($CCl_2F_2$) and $Cl_2$, or the like. It should be understood that the etchant species for the first and second steps are selected such that the etch rate of the first step is higher than the etch rate of the second step. Thus, a suitable etchant species for the second etch step is chlorine. Methods for etching polysilicon using reactive ion etching are well known to those skilled in the art. The portions of insulating masking layer 28 and the portions of gate oxide layer 26 not covered by polysilicon are removed, i.e., the exposed portions of insulating mask layer 28 and gate oxide layer 26.

Figure 14:
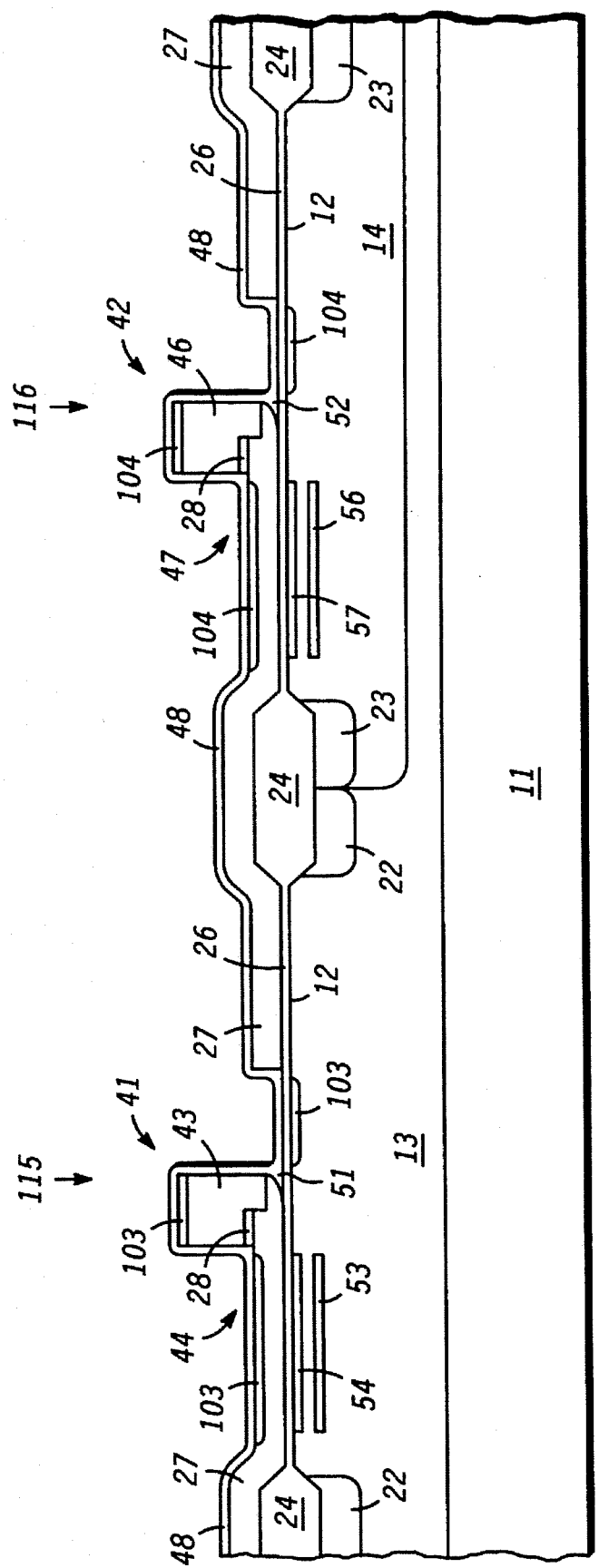

Now referring to FIG. 14, a layer of oxide 48 having a thickness ranging between approximately 100 angstroms and approximately 300 angstroms is formed on the exposed portions of P-type epitaxial layer 13, the exposed portions of layer of polysilicon 27, and on gate contact portions 43 and 46. A nominal thickness for oxide layer 48 is approximately 200 angstroms. Oxide layer 48 lowers gate to drain capacitances of transistors 115 and 116 by increasing a thickness of a portion 51 gate oxide layer 26 between major surface 12 and gate contact portion 43 and increasing a portion 52 of gate of oxide layer 26 between major surface 12 and gate contact portion 46. The lower gate to drain capacitance enhances the high frequency performance of complementary transistors 100 while simultaneously increasing their drain to source breakdown voltage. In addition, oxide layer 48 serves as a screen mask to protect layer of polysilicon 27, gate contact portions 43 and 46, and portions of P-type epitaxial layer 13 from ion implant damage.

Still referring to FIG. 14, a layer of photoresist (not shown) is formed on the portions of oxide layer 48 on gate contact portion 43, the portions of oxide layer 48 on major surface 12 adjacent gate structure 41, and over N-well 14, including gate contact portion 46 and gate extension 47. The layer of photoresist serves as an implant block mask to prevent impurity materials from being implanted into P-type epitaxial layer 13 adjacent gate structure 41, N-well 14, and gate structure 42. A drain extension implant is performed wherein an impurity material of N conductivity type is implanted through oxide layer 48 into layer of polysilicon 27, gate contact portion 43, and portions of N-well 14 over which layer of polysilicon 27 has been removed, i.e., portions of P-type epitaxial layer 13 adjacent gate contact portion 43. A suitable set of implant parameters for the drain extension implant includes implanting the phosphorus at a dose ranging between approximately 5×10$^{13}$ atoms/cm$^2$ and approximately 5×10$^{14}$ atoms/cm$^2$ at an implant energy ranging between approximately 15 KeV and approximately 40 KeV. The drain extension implant forms dopant regions 103 and serves to provide a lightly doped drain and to dope gate extension region 44.

The layer of photoresist is removed and another layer of photoresist (not shown) is formed on the portions of oxide layer 48 on gate contact portion 46, the portions of gate oxide 48 on major surface 12 adjacent gate structure 42, and over P-type epitaxial layer 13, including gate contact portion 43 and gate extension 44. The layer of photoresist serves as an implant block mask to prevent impurity materials from being implanted into the portion of N-well 14 adjacent gate structure 46, P-type epitaxial layer 13, and gate structure 41. A drain extension implant is performed wherein an impurity material of P conductivity type implanted through oxide layer 48 into layer of polysilicon 27, gate contact portion 46, and portions of N-well 14 over which layer of polysilicon 27 has been removed, i.e., portions of N-well 14 adjacent gate contact portion 46. A suitable set of implant parameters for the drain extension implant includes implanting the boron at a dose ranging between approximately 5×10$^{13}$ atoms/cm$^2$ and approximately 5×10$^{14}$ atoms/cm$^2$ at an implant energy ranging between approximately 5 KeV and approximately 15 KeV. The drain extension implant forms dopant regions 104 and serves to provide a lightly doped drain and to dope gate extension region 41.

A layer of photoresist (not shown) is formed on the portions of oxide layer 48 on gate contact portion 43, the portions of gate oxide 48 on major surface 12 adjacent gate structure 41, and over N-well 14, including gate contact portion 46 and gate extension 47. The layer of photoresist serves as an implant block mask to prevent impurity materials from being implanted into the portion of P-type epitaxial layer 13 on the drain side of gate structure 41, N-well 14, and gate structure 42. In accordance with the second embodiment, an impurity material of P conductivity type such as, for example, boron is implanted into a portion of P-type epitaxial layer 13 to form an enhanced dopant region 53. It should be noted that enhanced dopant region 53 is spaced apart from surface 12. A suitable set of implant parameters includes implanting the boron at a dose ranging between approximately 2×10$^{12}$ atoms/cm$^2$ and approximately 2×10$^{13}$ atoms/cm$^2$ at an implant energy ranging between approximately 40 KeV and approximately 100 KeV. Thus the boron forming enhanced dopant region 53 is implanted into P-type epitaxial layer 13 to a depth or distance ranging between approximately 1,500 and 3,000 angstroms. The impurity material or dopant forming enhanced dopant region 53 serves to provide punch-through protection of an N-channel transistor 115.

Another implant is performed wherein the boron is implanted into P-type epitaxial layer 13 to form an enhanced dopant region 54. Suitable implant parameters for the formation of enhanced dopant region 54 include a dose ranging between approximately 5×10$^{11}$ atoms/cm$^2$ and approximately 1×10$^{13}$ atoms/cm$^2$ and a suitable implant energy ranging between approximately 10 KeV and approximately 20 KeV. Thus the boron forming enhanced dopant region 54 is implanted into P-type epitaxial layer 13 to a depth or distance ranging between approximately 200 and 1,200 angstroms. The impurity material forming enhanced dopant region 54 serves to adjust the threshold voltage for N-channel transistor 115.

The layer of photoresist is removed and another layer of photoresist (not shown) is formed on the portions of oxide layer 48 on gate contact portion 46, the portions of gate oxide 48 on major surface 12 adjacent gate structure 42, and over a P-type epitaxial layer 13, including gate contact portion 43 and gate extension 44. The layer of photoresist serves as an implant block mask to prevent impurity materials from being implanted into the portion of N-well 14 on the drain side of gate structure 42, P-type epitaxial layer 13, and gate structure 41. In accordance with the second embodiment, an impurity material of N conductivity type such as, for example, phosphorus is implanted into N-well 14 to form an enhanced dopant region 56. It should be noted that enhanced dopant region 56 is spaced apart from surface 12. A suitable set of implant parameters includes implanting the phosphorus at a dose ranging between approximately 2×10$^{12}$ atoms/cm$^2$ and approximately 2×10$^{13}$ atoms/cm$^2$ using an implant energy ranging between approximately 40 KeV and approximately 100 KeV. Thus the phosphorus forming enhanced dopant region 56 is implanted into N-well 14 a depth or distance ranging between approximately 1,500 and 3,000 angstroms. The impurity material forming enhanced dopant region 56 serves to provide punch-through protection for P-channel transistor 116.

Another implant is performed wherein the phosphorus is implanted into N-well 14 to form an enhanced dopant region 57. Suitable implant parameters for the formation of enhanced dopant region 57 include a dose ranging between approximately 5×10$^{11}$ atoms/cm$^2$ and approximately 1×10$^{13}$ atoms/cm$^2$ using an implant energy ranging between approximately 20 KeV and approximately 40 KeV. Thus the phosphorus forming enhanced dopant region 57 is implanted into N-well 14 to a depth or distance ranging between approximately 200 and 1,200 angstroms. The dopant forming enhanced dopant region 57 serves to adjust the threshold voltage of P channel transistor 116. The layer of photoresist is removed.

Figure 15:
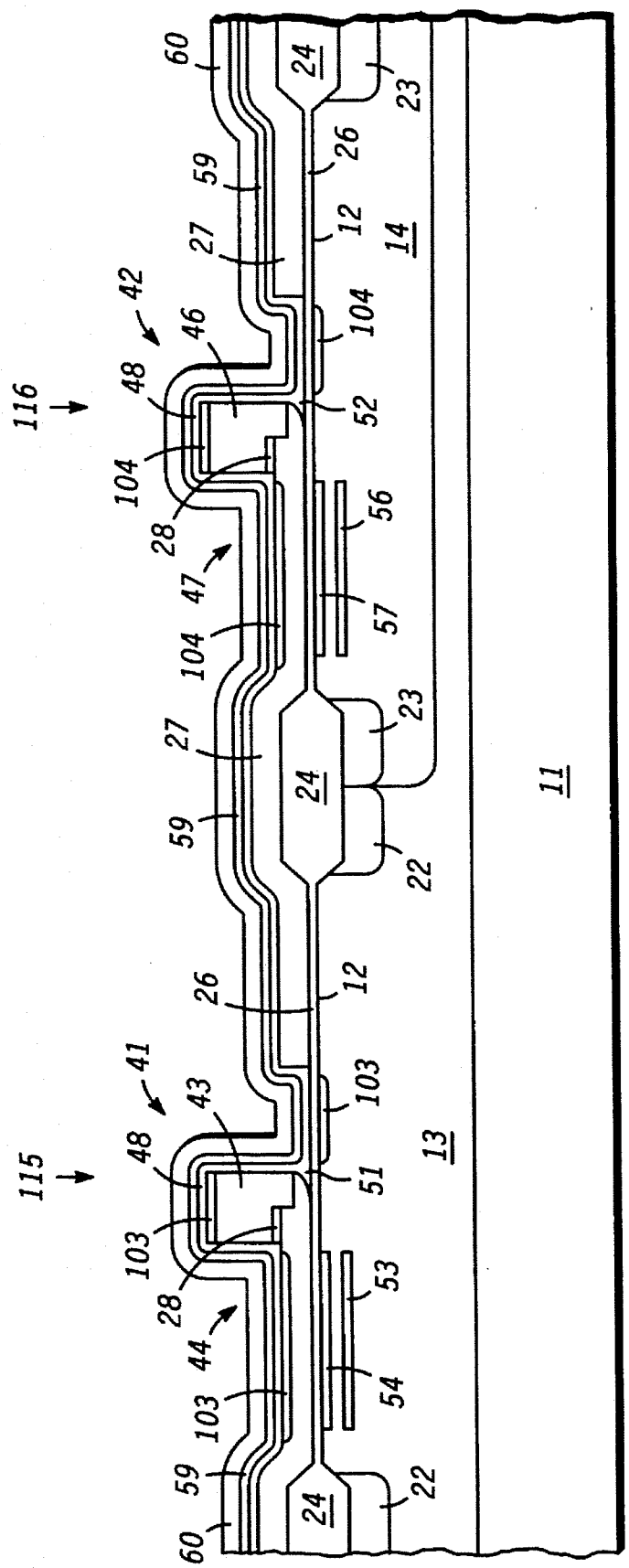

Now referring to FIG. 15, a conformal layer of insulating material 59 is formed on oxide layer 48. By way of example, conformal layer of insulating material 59 is silicon nitride having a thickness up to approximately 2,250 angstroms. It should be understood that including layer 59 is optional, however layer 59 prevents etch pitting of major surface 12 in, for example, surface topologies used in multiple input gate configurations. A nominal thickness of silicon nitride layer 59 is 750 angstroms. After formation of silicon nitride layer 59, a conformal layer of insulating material 60 is formed on silicon nitride layer 59. A suitable material for insulating material 60 is oxide formed by the decomposition of tetraethyl orthosilicate. The thickness of oxide layer 60 ranges up to approximately 2,250 angstroms with a nominal thickness of 1,000 angstroms. It should be noted that during the formation of layers 59 and 60, the impurity materials of enhanced dopant regions 53, 54, 56, and 57 diffuse into P-type epitaxial layer 13 and N-well 14, respectively. It should be further noted that in place of the combination of layers 59 and 60 a single layer of silicon nitride or a single layer of oxide may be used.

Figure 16:
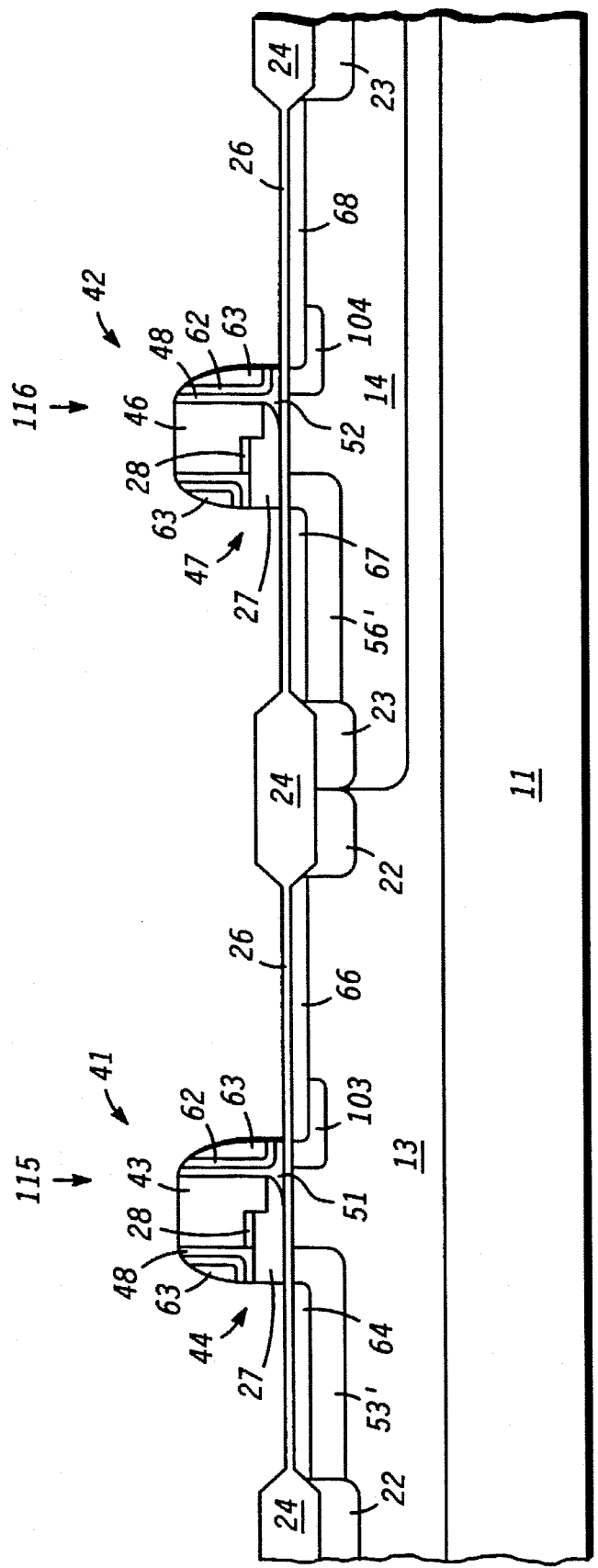

Now referring to FIG. 16, conformal layers 60 and 59 are anisotropically etched to form spacers 63 and 62, respectively. After forming spacers 63 and 62, layer of oxide 48 is anisotropically etched to expose the portions of layer of polysilicon 27 that are not under gate contact portions 43 and 46 and under spacers 63 and 62. The portions of layer of polysilicon 27 exposed by the anisotropic etching step are removed by an isotropic etch to expose portions of gate oxide layer 26. Thus, each L-shaped gate structure 41 and 42 has first, second, and third sides, wherein the second side is between the first and third sides.

Still referring to FIG. 16, a layer of photoresist (not shown) is formed on gate structure 42, the exposed portions of gate oxide layer 26 on major surface 12 of N-well 14 and the exposed portions of major surface 12 of N-well 14. The layer of photoresist serves as an implant block mask to define the source and drain regions of P-type epitaxial layer 13. It should be noted that an implant block mask is not formed on gate structure 41, thereby allowing doping of gate structure 41 during the source/drain implant. In other words, the layer of photoresist serves as an implant block mask to prevent impurity materials from being implanted into N-well 14 and gate structure 42. A source/drain implant is performed to form a source region 64 and a drain region 66. In addition, the source/drain implant dopes gate structure 41. A suitable set of implant parameters for the source/drain implant includes implanting an N type impurity material such as arsenic, at a dose ranging between approximately $1 \times 10^{15}$ atoms/cm$^2$ and approximately $1 \times 10^{16}$ atoms/cm$^2$, and a suitable implant energy ranging between approximately 60 KeV and approximately 160 KeV.

The layer of photoresist is removed and another layer of photoresist is formed on gate structure 41, the exposed portions of gate oxide layer 26 on major surface 12 of P-type epitaxial layer 13 and the exposed portions of major surface 12 of P-type epitaxial layer 13. The layer of photoresist serves as an implant block mask to define the source and drain regions of N-well 14. It should be noted that an implant block mask is not formed on gate structure 42, thereby allowing doping of gate structure 42 during the source/drain implant. In other words, the layer of photoresist serves as an implant block mask to prevent impurity materials from being implanted into P-type epitaxial layer 13 and gate structure 41. A source/drain implant is performed to form a source region 67 and a drain region 68. In addition, the source/drain implant further dopes gate structure 42. A suitable set of implant parameters for the source/drain implant includes implanting a P type impurity material such as boron, at a dose ranging between approximately $1 \times 10^{15}$ atoms/cm$^2$ and approximately $5 \times 10^{15}$ atoms/cm$^2$ and a suitable implant energy ranging from approximately 5 KeV to approximately 15 KeV. The layer of photoresist is removed. Although enhanced dopant regions 53 and 54 are initially spaced apart, it should be noted that they diffuse towards each other and form a single enhanced dopant region 53'. Likewise, enhanced dopant regions 56 and 57 diffuse towards each other and form a single enhanced dopant region 56'.

Figure 17:
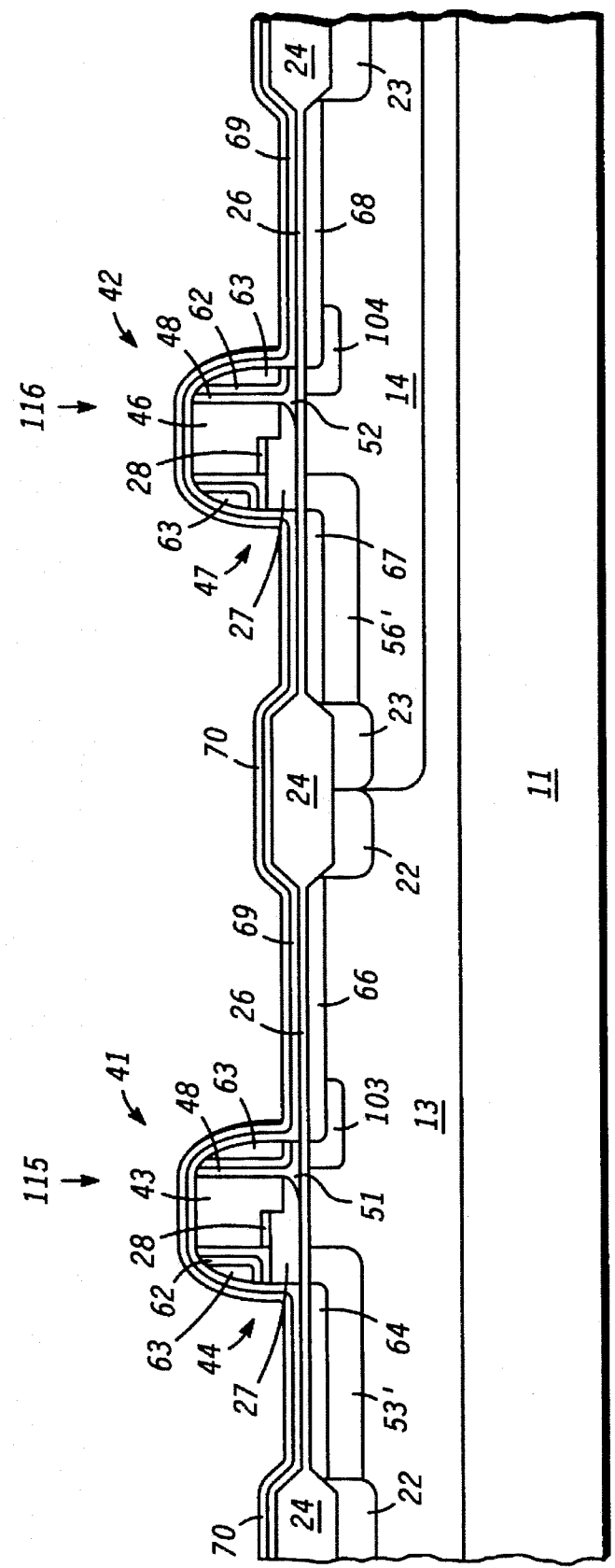

Now referring to FIG. 17, a conformal layer of insulating material 69 is formed on the exposed portions of layer of gate oxide 26, spacers 63, the exposed portions of oxide layer 48, and on gate structures 41 and 42. By way of example, conformal layer of insulating material 69 is silicon nitride having a thickness ranging between approximately 500 angstroms and 2,250 angstroms. A nominal thickness of silicon nitride layer 69 is 750 angstroms. Optionally, after formation of silicon nitride layer 69, a conformal layer of insulating material 70 is formed on silicon nitride layer 69. A suitable material for insulating material 70 is oxide formed by the decomposition of tetraethyl orthosilicate. Layer of insulating material 70 may have a thickness up to approximately 1,000 angstroms with a nominal thickness of 750 angstroms.

Figure 18:
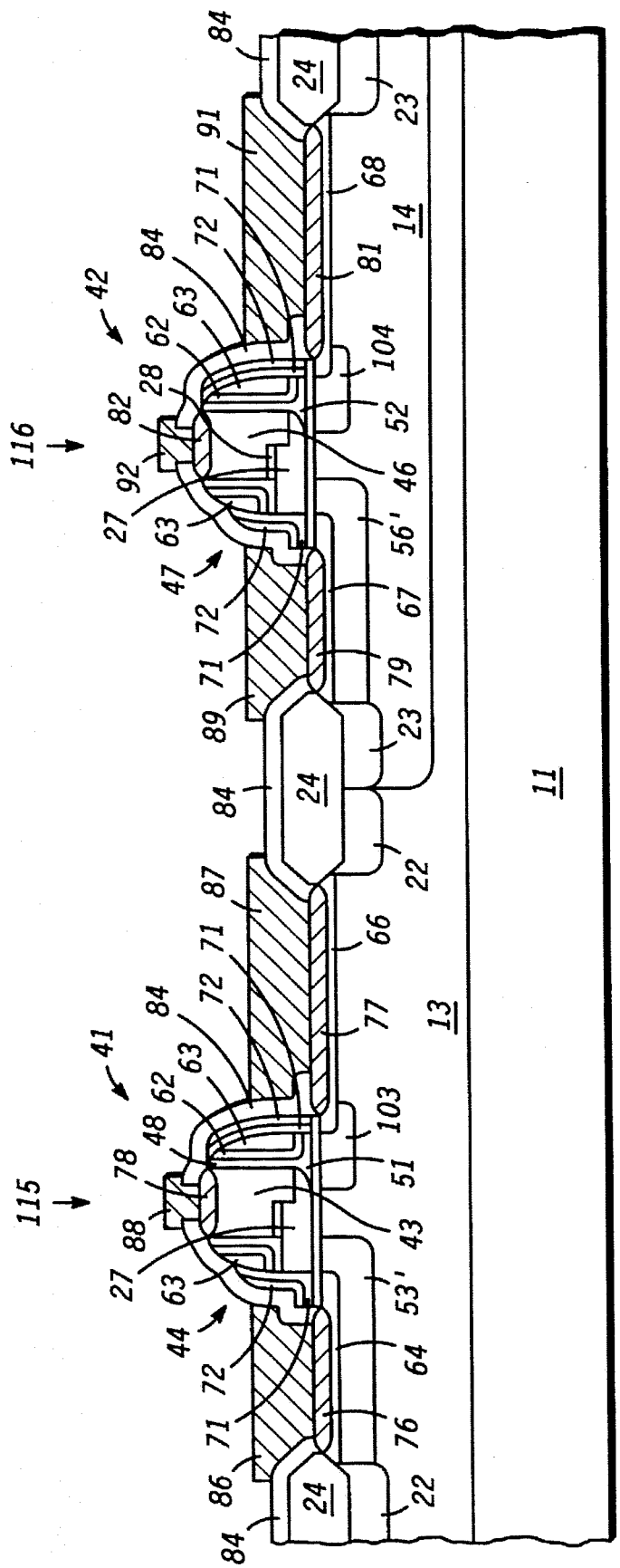

Now referring to FIG. 18, oxide layer 70 and silicon nitride layer 69 are anisotropically etched to form oxide spacers 72 and nitride spacers 71 adjacent spacers 63. In addition, the anisotropic etch step exposes the portions of major surface 12 adjacent oxide spacers 72 as well as gate contact portions 43 and 46 of gate structures 41 and 42, respectively. A silicide 76 is formed on dopant region 64, a silicide 77 is formed on dopant region 66, a silicide 78 is formed on the exposed portions of gate structure 41, a silicide 79 is formed dopant region 67, a silicide 81 is formed dopant region 67, and a silicide 82 is formed on the exposed portions of gate structure 42.

A layer of dielectric material 84, such as, for example, oxide is formed on field oxide regions 24, spacers 72 and silicide 76, 77, 78, 79, 81, and 82. Openings are formed in oxide 84 to expose portions of silicide 76, 77, 78, 79, 81, and 82. Using techniques well known in the art, electrical conductors or electrodes are formed which contact the exposed silicide. More particularly, a source conductor 86 contacts silicide 76, a drain conductor 87 contacts silicide 77, and a gate conductor 88 contacts silicide 78. Thus, source, drain, and gate conductors 86, 87, and 88, respectively, form conductors for N-channel transistor 115. Likewise, a source conductor 89 contacts silicide 79, a drain conductor 91 contacts silicide 81, and a gate conductor 92 contacts silicide 82. Thus, source, drain, and gate conductors 89, 91, and 92, respectively, form conductors for P-channel transistor 116.

Figure 19:
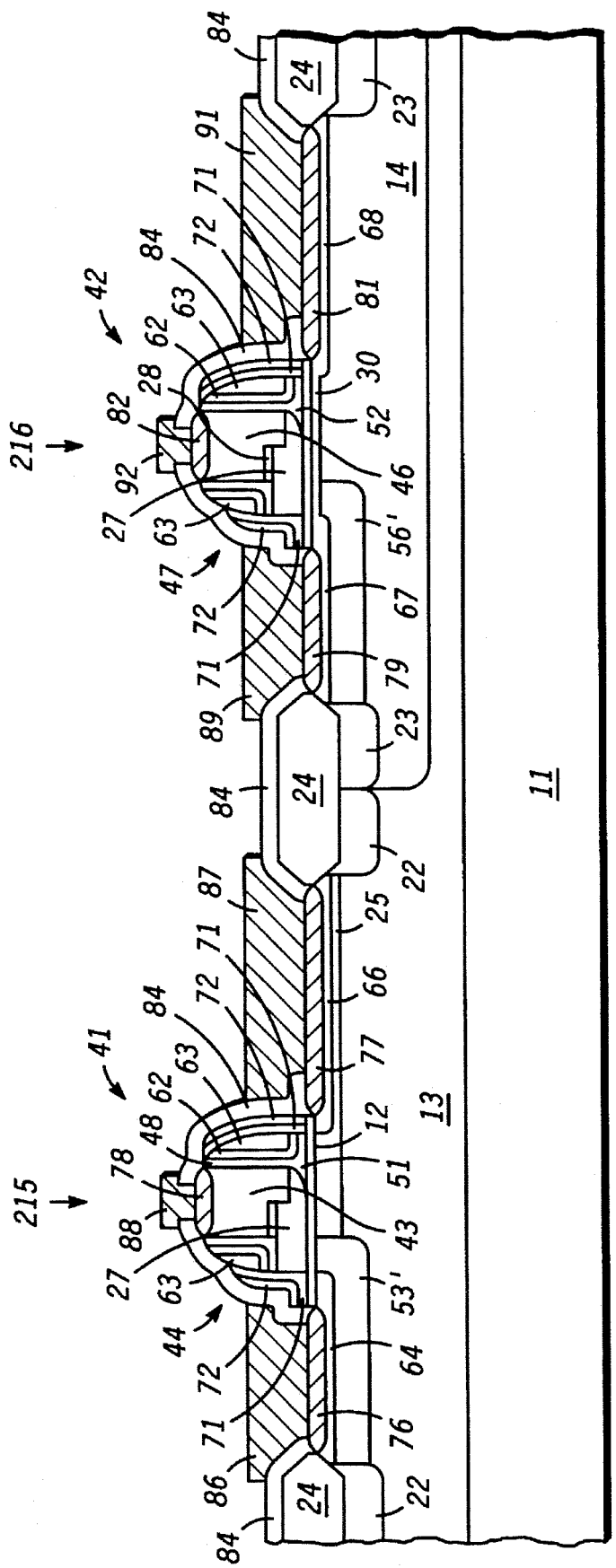
FIG. 19 illustrates a highly enlarged cross-sectional view of an insulated gate semiconductor device in accordance with a third embodiment of the present invention.

FIG. 19 illustrates a highly enlarged cross-sectional view of a portion of complementary insulated gate semiconductor devices 200 during processing in accordance with a third embodiment of the present invention. Complementary insulated gate semiconductor devices 200 include an N-channel transistor 215 fabricated in a portion of a P-type epitaxial layer 13 and a buried P-channel transistor 216 fabricated in a portion of an N-well 14. The process steps for forming complementary insulated gate semiconductor devices 200 follows the steps described for manufacturing complementary insulated gate semiconductor devices 10 and 100. However, to form buried P-channel transistor 216, two modifications are made to the processes for forming insulated gate semiconductor devices 10 and 100. In the first modification, dopant layer 30 is of P conductivity type and has a surface concentration ranging from approximately $7 \times 10^{16}$ atoms/cm$^3$ to approximately $2 \times 10^{17}$ atoms/cm$^3$. A suitable set of implant conditions to obtain the aforementioned surface concentration includes an implant dose ranging from approximately $1 \times 10^{12}$ atoms per square centimeter (atoms/cm$^2$) to approximately $3 \times 10^{12}$ atoms/cm$^2$ and an implant energy ranging from approximately 50 kilo-electron volts (KeV) to approximately 200 KeV.

In the second modification (and referring to the processing steps for manufacturing insulated gate semiconductor devices 10), gate contact portion 46 and gate extension 47 of gate structure 42 are doped with an impurity material of N conductivity type. More particularly, gate structure 42 is doped during the formation of source and drain regions 64 and 66, respectively. Thus, dopant region 30 is formed at the same time as dopant region 25, and gate contact portion 6 and gate extension 47 are preferably doped at the same time as gate contact portion 43 and gate extension 44, i.e., gate structures 42 and 41 are preferably doped at the same time. It should be noted that a buried P-channel transistor can be manufactured by including a modification to process steps for forming insulated gate field effect transistors 100 that is similar to the process steps for forming insulated gate field effect transistor 10.

By now it should be appreciated that an insulated gate semiconductor device and a method of manufacturing the insulated gate semiconductor device have been provided. Insulated gate semiconductor devices manufactured in accordance with the present invention have a gate structure comprising a gate contact portion and a gate extension portion that stabilizes the threshold voltage at for insulated gate field effect transistors operating at power supply voltages ranging less than 3 volts, i.e., low power insulated field effect transistors.

We claim:

1. A method for fabricating an insulated gate semiconductor device, comprising the steps of:

providing a semiconductor material of a first conductivity type and having a major surface;

forming a layer of dielectric material on the major surface;

forming a first portion of a first gate structure having first and second sides on a first portion of the layer of dielectric material;

forming a second portion of the first gate structure having first and second sides on a subportion of the first portion of the first gate structure, wherein the first side of the first portion of the first gate structure and the first side of the second portion of the first gate structure are aligned;

forming at least one enhanced dopant region of the first conductivity type in a first portion of the semiconductor material, the at least one enhanced dopant region aligned to the second side of the second portion of the first gate structure;

forming a first dopant region in a second portion of the semiconductor material, the first dopant region of a second conductivity type and aligned to the first side of the first portion of the first gate structure and to the first side of the second portion of the first gate structure; and forming a second dopant region in a third portion of the semiconductor material, the second dopant region of the second conductivity type and aligned to the second side of the first portion of the first gate structure.

2. The method of claim 1, wherein the step of forming a second portion of the first gate structure includes thickening a subportion of the first portion of the layer of dielectric material.

3. The method of claim 1, wherein the step of providing a semiconductor material includes forming a first dopant layer of the second conductivity type extending into the semiconductor material from the major surface.

4. The method of claim 1, wherein the step of forming a second portion of the first gate structure includes doping the first and second portions of the first gate structure with a dopant of the second conductivity type.

5. The method of claim 1, further including providing the semiconductor material as a semiconductor substrate having an epitaxial layer of the first conductivity type disposed thereon.

6. The method of claim 1, wherein the step of forming at least one enhanced dopant region of a first conductivity type includes forming two enhanced dopant regions, a first of the two enhanced dopant regions positioned further into the semiconductor material from the major surface than a second of the two enhanced dopant regions.

7. The method of claim 1, wherein the step of forming at least one enhanced dopant region of a first conductivity type includes forming an enhanced dopant region spaced apart from the major surface.

8. The method of claim 1, further including the steps of:

forming a dopant well of the second conductivity type extending into a portion of the semiconductor material;

forming a first portion of a second gate structure having first and second sides on a second portion of the layer of dielectric material;

forming a second portion of the second gate structure having first and second sides on a subportion of the first portion of the second gate structure, wherein the first side of the first portion of the second gate structure is aligned to the first side of the second portion of the second gate structure;

forming at least one enhanced dopant region of the second conductivity type in a first portion of the dopant well, the at least one enhanced dopant region aligned to the second side of the second portion of the second gate structure;

forming a first dopant region in a second portion of the dopant well, the first dopant region of the first conductivity type and aligned to the first side of the first portion of the second gate structure; and forming a second dopant region in a third portion of the dopant well, the second dopant region of the first conductivity type and aligned to the second side of the first portion of the second gate structure.

9. The method of claim 8, wherein the step of forming a second portion of the second gate structure includes thickening a subportion of the second portion of the layer of dielectric material.

10. The method of claim 8, wherein the step of forming a dopant well includes forming a first dopant layer of the first conductivity type extending into the dopant well from the major surface.

11. The method of claim 8, wherein the step of forming a dopant well of the second conductivity type includes forming a first dopant layer of the first conductivity type extending into the semiconductor material from the major surface and contained within the dopant well of the second conductivity type, and further including forming an enhanced dopant region of the second conductivity type spaced apart from the major surface and aligned to the second side of the second portion of the second gate structure, and doping the first and second portions of the second gate structure with impurities of the second conductivity type.

12. A method for fabricating an insulated gate semiconductor device, comprising the steps of:

providing a semiconductor material of a first conductivity type and having a major surface;

forming a first layer of dielectric material on the major surface;

forming a first L-shaped gate structure on a first portion of the first layer of dielectric material, the first L-shaped gate structure having first and second sides;

forming at least one dopant region of the first conductivity type in a first portion of the semiconductor material, the first portion of the semiconductor material adjacent the second side of the first L-shaped gate structure;

forming a first dopant region of a second conductivity type in the at least one dopant region of the first conductivity type; and forming a second dopant region of the second conductivity type in a second portion of the semiconductor material, the second portion of the semiconductor material adjacent the first side of the first L-shaped gate structure.

13. The method of claim 12, wherein the step of forming a first L-shaped gate structure on a first portion of the first layer of dielectric material includes the steps of:

forming a first silicon layer;

forming a second layer of dielectric material on the first silicon layer, wherein the second layer of dielectric material has at least one opening having first and second sides, the at least one opening exposing a portion of the first silicon layer;

forming a second silicon layer over the second layer of dielectric material and the portion of the first silicon layer that is exposed, wherein the second layer of dielectric material is thicker than the first layer of dielectric material;

forming a masking layer having first and second sides, wherein the first side of the at least one opening in the second layer of dielectric material is between the first and second sides of the masking layer; and anisotropically etching the second and first silicon layers to form the first and second sides of the first L-shaped gate structure.

14. The method of claim 13, further including implanting impurities of the second conductivity type into a portion of the L-shaped gate structure, the portion of the first silicon layer adjacent the second side of the L-shaped gate structure, and the semiconductor material adjacent the first side of the first L-shaped gate structure.

15. The method of claim 13, further including the steps of:

forming a third layer of dielectric material on the first L-shaped gate structure of a first thickness;

anisotropically etching portions of the second and third layers of dielectric material, wherein a first spacer is formed adjacent the first side of the first L-shaped gate structure and a second spacer is formed adjacent second side of the first L-shaped gate structure; and anisotropically etching portions of the first silicon layer to expose a portion of the first layer of dielectric material which is aligned to the second spacer and to form a third side of the first L-shaped gate structure, wherein the second side of the first L-shaped gate structure is between the first and third sides of the first L-shaped gate structure.

16. The method of claim 15, wherein the step of forming the third layer of dielectric material includes forming a first sublayer of dielectric material comprising silicon nitride and forming a second sublayer of dielectric material comprising silicon dioxide.

17. The method of claim 15, further including the steps of:

conformally coating the first L-shaped gate structure with a fourth layer of dielectric material;

forming a fifth layer of dielectric material on the fourth layer of dielectric material; and anisotropically etching the fifth, fourth, and first layers of dielectric material to form third and fourth spacers, the third spacer adjacent the first spacer, the fourth spacer adjacent the second spacer and to form exposed portions of the major surface and a portion of the second silicon layer that is exposed.

18. The method of claim 17, further including forming the fourth layer of dielectric material from oxide, and wherein the step of forming the fifth layer of dielectric material includes forming a first sublayer of dielectric material comprising silicon nitride and forming a second sublayer of dielectric material comprising oxide.

19. The method of claim 12, further including the steps of:

forming a dopant well of the second conductivity type extending into a portion of the semiconductor material;

forming a second L-shaped gate structure on a first portion of the first layer of dielectric material, the second L-shaped gate structure having first and second sides;

forming at least one dopant region of the second conductivity type in a first portion of the dopant well, the first portion of the at least one dopant region adjacent the second side of the second L-shaped gate structure;

forming a third dopant region of the first conductivity type in the at least one dopant region of the first conductivity type; and forming a fourth dopant region of the first conductivity type in a second portion of the semiconductor material, the second portion of the semiconductor material adjacent the first side of the second L-shaped gate structure.

* * * * *